United States Patent
Chen

(10) Patent No.: US 10,851,622 B2
(45) Date of Patent: Dec. 1, 2020

(54) THREE DIMENSIONAL MODELING OF INTERACTIONS BETWEEN DOWNHOLE DRILLING TOOLS AND ROCK CHIPS

(71) Applicant: Halliburton Energy Services, Inc., Houston, TX (US)

(72) Inventor: Shilin Chen, Montgomery, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 493 days.

(21) Appl. No.: 15/124,077

(22) PCT Filed: Apr. 7, 2014

(86) PCT No.: PCT/US2014/033193
§ 371 (c)(1),
(2) Date: Sep. 7, 2016

(87) PCT Pub. No.: WO2015/156764
PCT Pub. Date: Oct. 15, 2015

(65) Prior Publication Data
US 2017/0016307 A1    Jan. 19, 2017

(51) Int. Cl.
*E21B 41/00* (2006.01)
*E21B 10/55* (2006.01)
(Continued)

(52) U.S. Cl.
CPC .......... *E21B 41/0092* (2013.01); *E21B 10/55* (2013.01); *E21B 10/567* (2013.01); *G06F 30/20* (2020.01)

(58) Field of Classification Search
CPC .... E21B 41/0092; E21B 10/55; E21B 10/567; G06F 17/5009; G06F 17/50; G06F 30/20
See application file for complete search history.

(56) References Cited

U.S. PATENT DOCUMENTS 5,730,234 A   3/1998  Putot
6,021,859 A   2/2000  Tibbitts et al.
(Continued)

FOREIGN PATENT DOCUMENTS

CN   201013245   1/2008

OTHER PUBLICATIONS

Hareland, Geir, et al. "Cutting efficiency of a single PDC cutter on hard rock." Journal of Canadian Petroleum Technology 48.06 (2009): 60-65. (Year: 2009).*

(Continued)

*Primary Examiner* — Omar F Fernandez Rivas
*Assistant Examiner* — Joshua E. Jensen
(74) *Attorney, Agent, or Firm* — Baker Botts L.L.P.

(57) ABSTRACT

In accordance with some embodiments of the present disclosure, a method of modeling a downhole drilling tool is disclosed. The method may include identifying a location for each of a plurality of cutlets associated with each of a plurality of cutting elements. The method may further include calculating a depth of cut for each cutlet based on the location of the cutlet and a three dimensional model of a borehole bottom. Additionally, the method may include generating a three dimensional model of a rock chip for each cutting element, in response to at least one depth of cut being greater than a critical depth of cut, each three dimensional model including a two dimensional model of a rock chip associated with each cutlet. The method may also include updating the three dimensional model of the borehole bottom by removing each three dimensional model of a rock chip.

25 Claims, 16 Drawing Sheets

(51) Int. Cl.
*G06F 30/20* (2020.01)
*E21B 10/567* (2006.01)

(56) References Cited

U.S. PATENT DOCUMENTS

| | | | |
|---|---|---|---|
| 8,037,951 | B2 | 10/2011 | Shen et al. |
| 8,150,667 | B2 | 4/2012 | Ledgerwood |
| 8,437,995 | B2 | 5/2013 | Matthews et al. |
| 8,589,124 | B2 | 11/2013 | Huang |
| 8,720,611 | B2 | 5/2014 | Chen |
| 2004/0011159 | A1 | 1/2004 | Meiners et al. |
| 2005/0015229 | A1* | 1/2005 | Huang .................. E21B 10/00 703/10 |
| 2009/0166091 | A1 | 7/2009 | Matthews et al. |
| 2012/0111630 | A1* | 5/2012 | Chen .................... E21B 10/43 175/45 |
| 2012/0152624 | A1* | 6/2012 | Chen .................... E21B 10/43 175/428 |
| 2013/0238245 | A1 | 9/2013 | Chen et al. |
| 2014/0110181 | A1* | 4/2014 | Zhang .................. E21B 10/55 175/428 |

OTHER PUBLICATIONS

Dupriest, Fred E., and William L. Koederitz. "Maximizing drill rates with real-time surveillance of mechanical specific energy." SPE/IADC Drilling Conference. Society of Petroleum Engineers, 2005. (Year: 2005).*

Gerbaud, Laurent, Stephane Menand, and Hedi Sellami. "PDC bits: all comes from the cutter rock interaction." IADC/SPE Drilling Conference. 2006. (Year: 2006).*

Chen, Shilin, Rob Arfele, and Kevin Glass. "Modeling of the Effects of Cutting Structure, Impact Arrestor, and Gage Geometry on PDC Bit Steerability." paper AADE-07-NTCE-10 presented at 2007 AADE Technical Conference held in Houston, TX, 2007. (Year: 2007).*

Jaime, Maria Carolina. Numerical modeling of rock cutting and its associated fragmentation process using the finite element method. Diss. University of Pittsburgh, 2011. (Year: 2011).*

Chen, Shilin, et al. "The role of 3D rock chips and cutting area shapes in PDC bit-design optimization." Abu Dhabi International Petroleum Exhibition and Conference. Society of Petroleum Engineers, 2014. (Year: 2014).*

Office Action for Chinese Patent Application No. 201480076874.3, dated Mar. 26, 2018; 10 pages.

Yan, Wenzhuo. "Chapter 7—Single PDC Cutter Force Model" Thesis, 1997 (New Mexico Institute of Mining & Technology); 126 pages.

Gerbaud, L., et al. "IADC/SPE 98988—PDC Bites: All Comes from the Cutter/Rock Interaction." 2006 (Paris School of Mines); 9 pages.

Block, Gareth, et al., "SPE 124870—Role of Failure Mode on Rock Cutting Dynamics" Society of Petroleum Engineers (2009); 9 pages.

Yan, Wenzhuo. "Single PDC cutter force modeling for hard rock cutting." Diss. New Mexico Institute of Mining and Technology, May 1997; 118 pages.

International Search Report and Written Opinion, Application No. PCT/US2014/0331193; 18 pgs, dated Jan. 8, 2015.

Office Action, Chinese Patent Application No. 201480076874.3, dated Nov. 20, 2018; 12 pages.

* cited by examiner

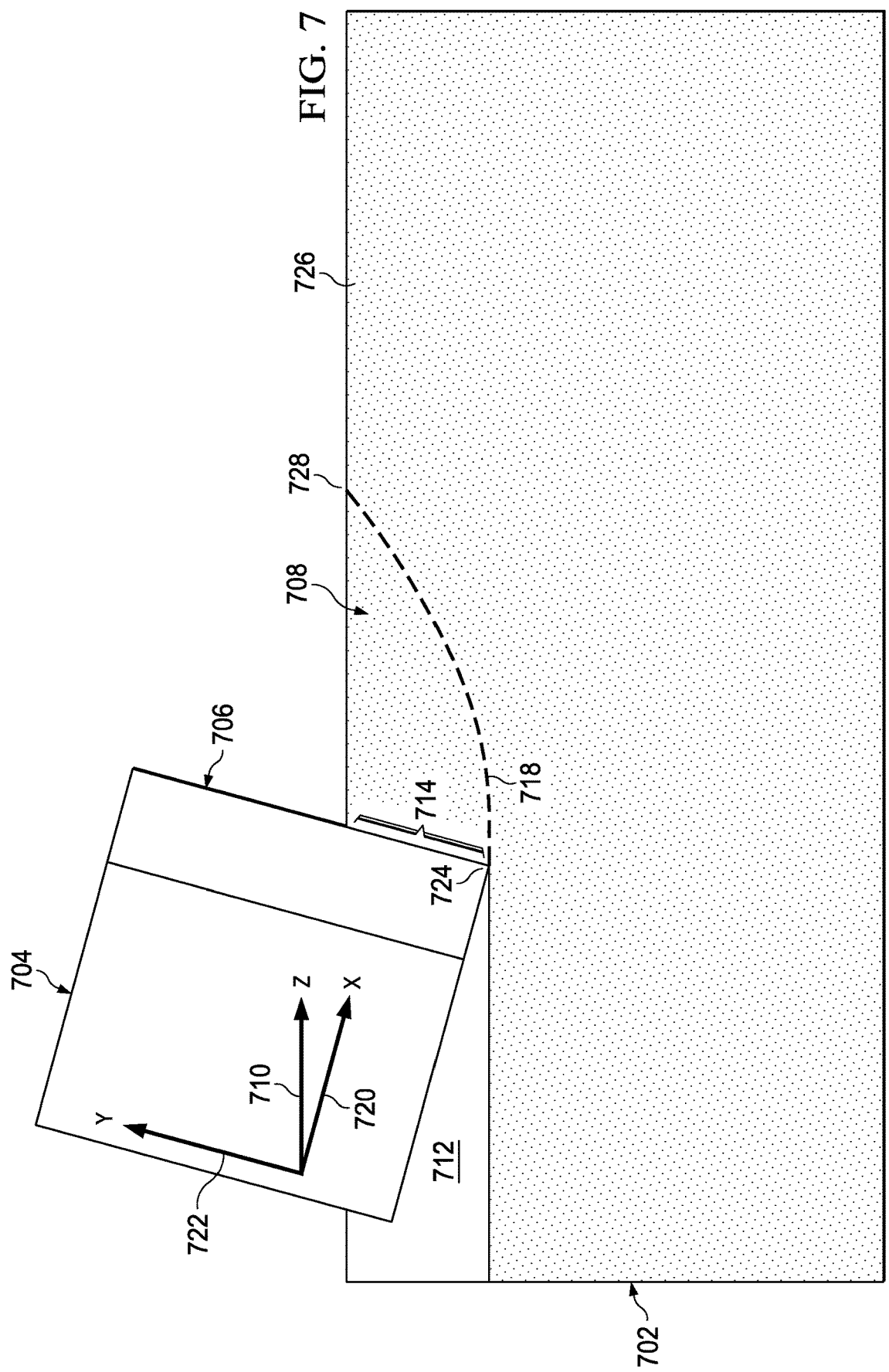

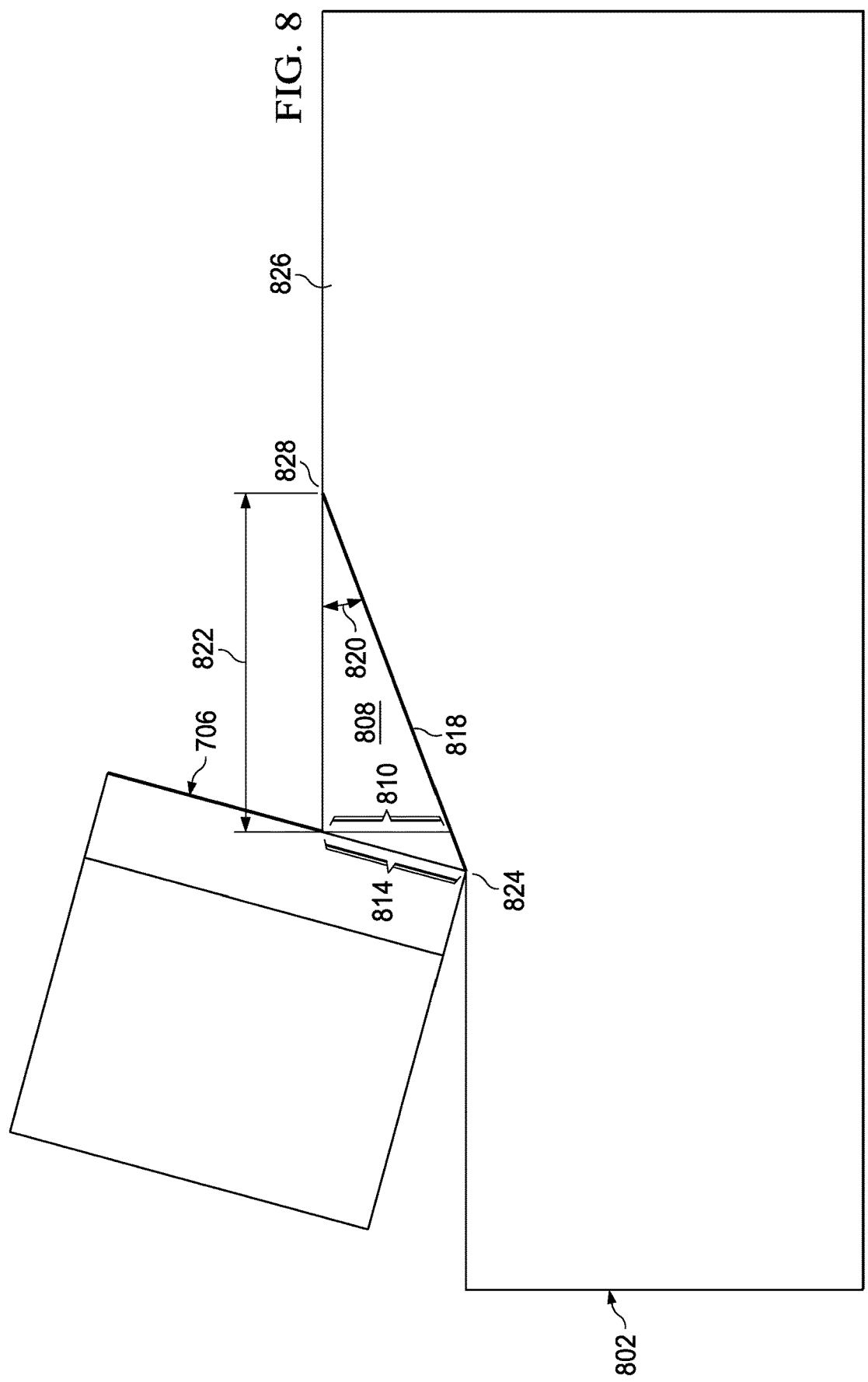

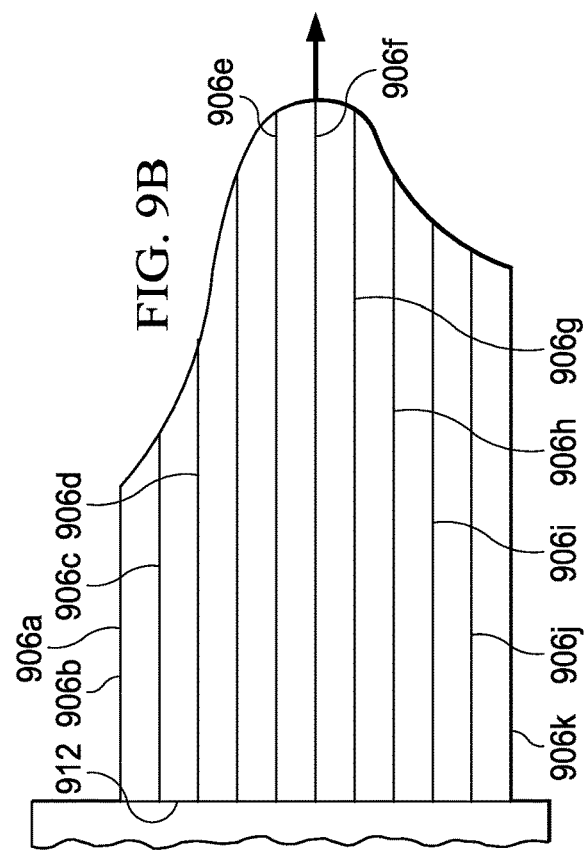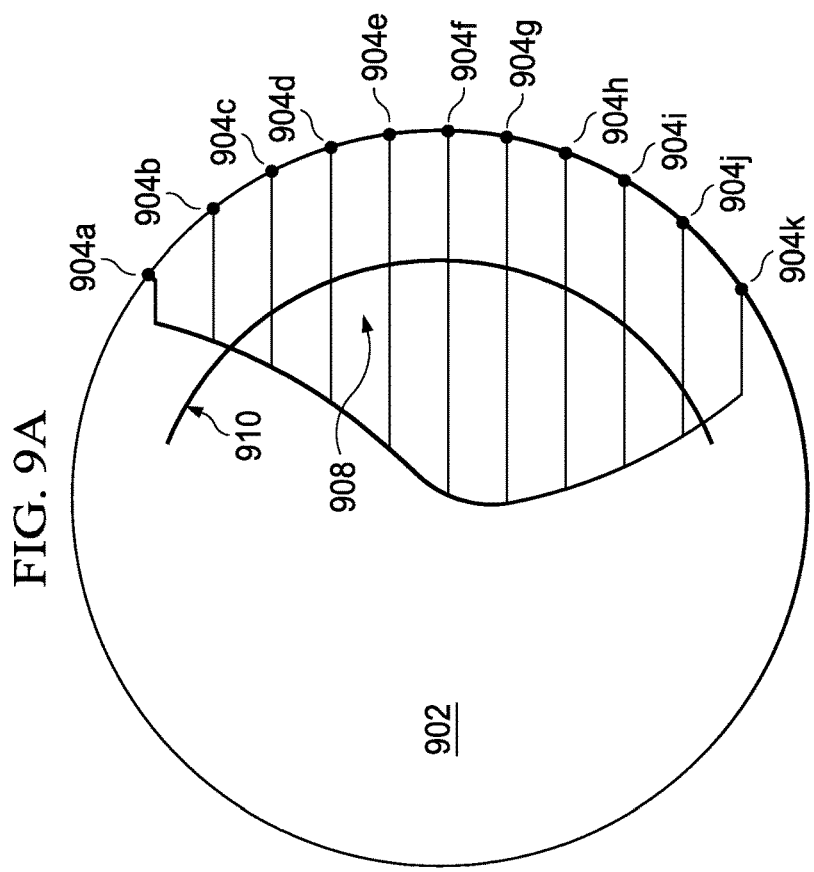

THREE DIMENSIONAL MODELING OF INTERACTIONS BETWEEN DOWNHOLE DRILLING TOOLS AND ROCK CHIPS

RELATED APPLICATIONS

This application is a U. S. National Stage Application of International Application No. PCT/US2014/033193 filed Apr. 7, 2014, which designates the United States, and which is incorporated herein by reference in its entirety.

TECHNICAL FIELD

The present disclosure relates generally to downhole drilling tools and, more particularly, to three dimensional modeling of interactions between downhole drilling tools and rock chips.

BACKGROUND

Various types of downhole drilling tools including, but not limited to, rotary drill bits, reamers, core bits, and other downhole tools have been used to form wellbores in associated downhole formations. Examples of such rotary drill bits include, but are not limited to, fixed cutter drill bits, drag bits, polycrystalline diamond compact (PDC) drill bits, and matrix drill bits associated with forming oil and gas wells extending through one or more downhole formations. Fixed cutter drill bits such as a PDC bit may include multiple blades that each include multiple cutting elements.

In typical drilling applications, a PDC bit may be used to drill through various levels or types of geological formations with longer bit life than non-PDC bits. Typical formations may generally have a relatively low compressive strength in the upper portions (e.g., lesser drilling depths) of the formation and a relatively high compressive strength in the lower portions (e.g., greater drilling depths) of the formation. Thus, it typically becomes increasingly more difficult to drill at increasingly greater depths. As well, the ideal bit for drilling at any particular depth is typically a function of the compressive strength of the formation at that depth. Accordingly, the ideal bit for drilling typically changes as a function of drilling depth.

One example model that has been used to model efficiency of downhole drilling tools is known as a single cutter force model. Single cutter force models may calculate forces acting on individual cutting elements and sum those forces to estimate total forces acting on the downhole drilling tool.

BRIEF DESCRIPTION OF THE DRAWINGS

For a more complete understanding of the present disclosure and its features and advantages, reference is now made to the following description, taken in conjunction with the accompanying drawings, in which:

FIG. 7 illustrates a cross sectional view of an exemplary cutting element engaged with a geophysical formation, in accordance with some embodiments of the present disclosure;

FIG. 8 illustrates a modeled approximation of a rock chip, in accordance with some embodiments of the present disclosure;

FIG. 9A illustrates a three dimensional rock chip divided into an exemplary group of cutlets, in accordance with some embodiments of the present disclosure;

FIG. 9B illustrates exemplary two dimensional rock chip lengths included in an associated three dimensional rock chip, in accordance with some embodiments of the present disclosure;

DETAILED DESCRIPTION

A drill bit model and related systems and methods are disclosed, directed to modeling drilling efficiency of downhole drilling tools. In broad terms, one aspect of the disclosed drilling tool model takes into consideration rock chips that may separate from a formation in advance of the faces of cutting elements during drilling. The amount of energy required to separate a particular volume of rock from a formation may correlate to the drilling efficiency of a drill bit. Thus, by considering these rock chips, the disclosed models are able to more accurately analyze or predict the drilling efficiency of downhole drilling tools. There are numerous ways in which rock chips may be considered and factored into downhole drilling tool models. Thus, embodiments of the present disclosure and its advantages are best understood by referring to FIGS. 1 through 13, where like numbers are used to indicate like and corresponding parts.

Figure 1:
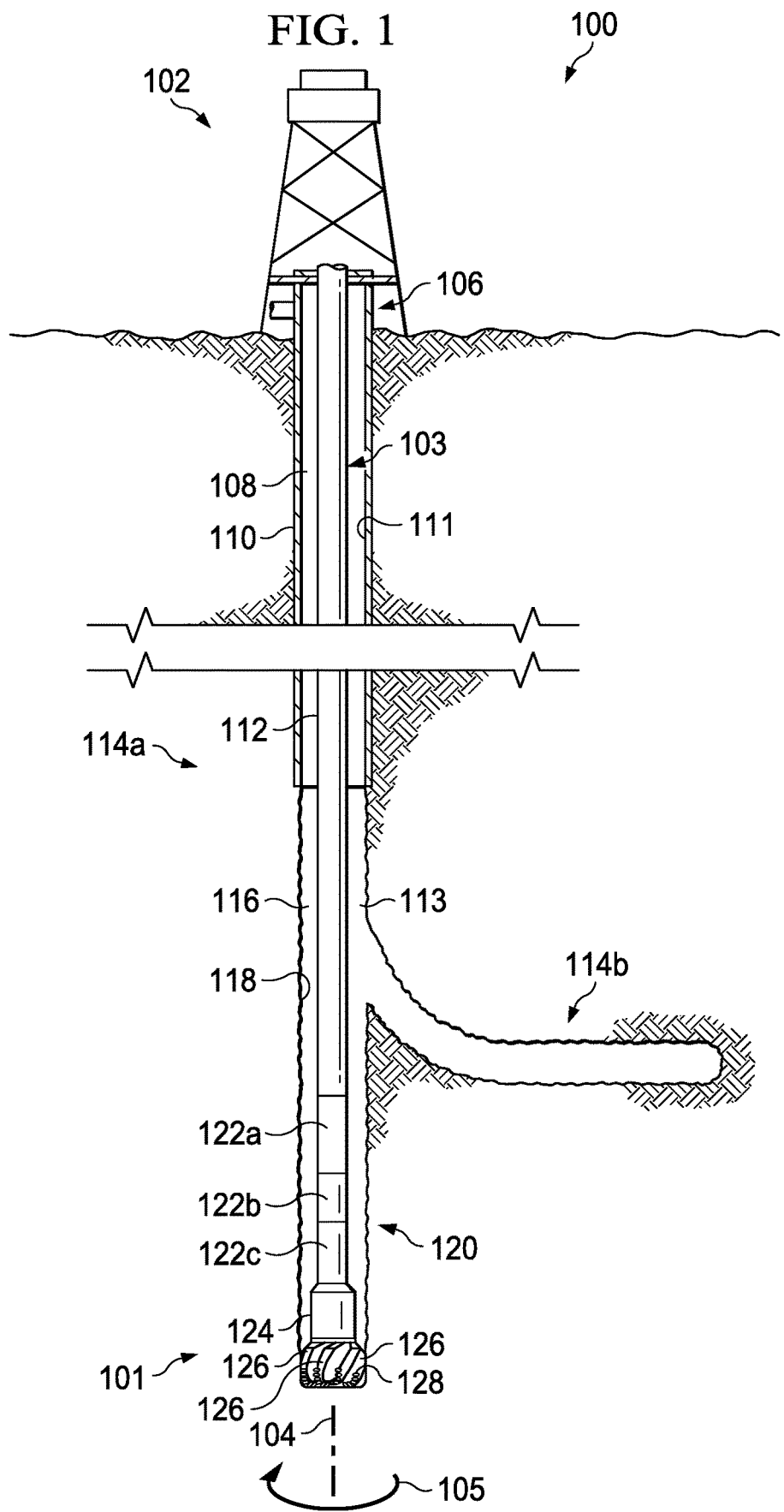
FIG. 1 illustrates an elevation view of an example embodiment of a drilling system, in accordance with some embodiments of the present disclosure.

FIG. 1 illustrates an elevation view of an example embodiment of drilling system 100, in accordance with some embodiments of the present disclosure. Drilling system 100 may include well surface or well site 106. Various types of drilling equipment such as a rotary table, drilling fluid pumps and drilling fluid tanks (not expressly shown) may be located at well surface or well site 106. For example, well site 106 may include drilling rig 102 that may have various characteristics and features associated with a "land drilling rig." However, downhole drilling tools incorporating teachings of the present disclosure may be satisfactorily used with drilling equipment located on offshore platforms, drill ships, semi-submersibles and drilling barges (not expressly shown).

Drilling system 100 may also include drill string 103 associated with drill bit 101 that may be used to form a wide variety of wellbores or bore holes such as generally vertical wellbore 114a or generally horizontal wellbore 114b or any combination thereof. Various directional drilling techniques and associated components of bottom hole assembly (BHA) 120 of drill string 103 may be used to form horizontal wellbore 114b. For example, lateral forces may be applied to BHA 120 proximate kickoff location 113 to form generally horizontal wellbore 114b extending from generally vertical wellbore 114a. The term "directional drilling" may be used to describe drilling a wellbore or portions of a wellbore that extend at a desired angle or angles relative to vertical. The desired angles may be greater than normal variations associated with vertical wellbores. Direction drilling may also be described as drilling a wellbore deviated from vertical. The term "horizontal drilling" may be used to include drilling in a direction approximately ninety degrees (90°) from vertical.

BHA 120 may be formed from a wide variety of components configured to form wellbore 114. For example, components 122a, 122b and 122c of BHA 120 may include, but are not limited to, drill bits (e.g., drill bit 101), coring bits, drill collars, rotary steering tools, directional drilling tools, downhole drilling motors, reamers, hole enlargers or stabilizers. The number and types of components 122 included in BHA 120 may depend on anticipated downhole drilling conditions and the type of wellbore that will be formed by drill string 103 and rotary drill bit 101. BHA 120 may also include various types of well logging tools (not expressly shown) and other downhole tools associated with directional drilling of a wellbore. Examples of logging tools and/or directional drilling tools may include, but are not limited to, acoustic, neutron, gamma ray, density, photoelectric, nuclear magnetic resonance, rotary steering tools and/or any other commercially available well tool. Further, BHA 120 may also include a rotary drive (not expressly shown) connected to components 122a, 122b and 122c and which rotates at least part of drill string 103 together with components 122a, 122b and 122c.

Wellbore 114 may be defined in part by casing string 110 that may extend from well surface 106 to a selected downhole location. Portions of wellbore 114, as shown in FIG. 1, that do not include casing string 110 may be described as "open hole." Various types of drilling fluid may be pumped from well surface 106 through drill string 103 to attached drill bit 101. The drilling fluids may be directed to flow from drill string 103 to respective nozzles (depicted as nozzles 156 in FIG. 2) passing through rotary drill bit 101. The drilling fluid may be circulated back to well surface 106 through annulus 108 defined in part by outside diameter 112 of drill string 103 and inside diameter 118 of wellbore 114a. Inside diameter 118 may be referred to as the "sidewall" of wellbore 114a Annulus 108 may also be defined by outside diameter 112 of drill string 103 and inside diameter 111 of casing string 110. Open hole annulus 116 may be defined as sidewall 118 and outside diameter 112.

Drilling system 100 may also include rotary drill bit ("drill bit") 101. Drill bit 101, discussed in further detail in FIG. 2, may include one or more blades 126 that may be disposed outwardly from exterior portions of rotary bit body 124 of drill bit 101. Blades 126 may be any suitable type of projections extending outwardly from rotary bit body 124. Drill bit 101 may rotate with respect to bit rotational axis 104 in a direction defined by directional arrow 105. Blades 126 may include one or more cutting elements 128 disposed outwardly from exterior portions of each blade 126. Blades 126 may also include one or more depth of cut controllers (not expressly shown) configured to control the depth of cut of cutting elements 128. Blades 126 may further include one or more gage pads (not expressly shown) disposed on blades 126. Drill bit 101 may be designed and formed in accordance with teachings of the present disclosure and may have many different designs, configurations, and/or dimensions according to the particular application of drill bit 101.

The configuration of cutting elements 128 on drill bit 101 and/or other downhole drilling tools may also contribute to the drilling efficiency of the drill bit. Cutting elements 128 may be laid out according to two general principles: single-set and track-set. In a single-set configuration, each of cutting elements 128 on drill bit 101 may have a unique radial position with respect to bit rotational axis 104. In a track-set configuration, at least two of cutting elements 128 of drill bit 101 may have the same radial position with respect to bit rotational axis 104. In some embodiments, the track-set cutting elements may be located on different blades of the drill bit. In other embodiments, the track-set cutting elements may be located on the same blade. Drill bits having cutting elements laid out in a single-set configuration may drill more efficiently than drill bits having a track-set configuration while drill bits having cutting elements laid out in a track-set configuration may be more stable than drill bits having a single-set configuration.

In some embodiments of the disclosure, it may be advantageous to model a drilling efficiency of a downhole drilling tool by incorporating interactions between downhole drilling tools and rock chips, as disclosed in further detail below. For example, during operation of drilling system 100, when drill bit 101 contacts the bottom of wellbore 114a or the end of horizontal wellbore 114b, blades 126 or cutting elements 128 may mechanically scrape the formations surrounding wellbores 114, causing pieces of rock to separate from the formations. In some embodiments, drill bit 101 may further cause rock chips to separate from the formations in advance of blades 126 or cutting elements 128. The amount of energy required to separate a particular volume of rock from a formation may correlate to the drilling efficiency of a drill bit. While drilling into different types of geological formations it may be advantageous to optimize the design or model the drilling efficiency of downhole drilling tools in order to select a downhole drilling tool that maximizes drilling efficiency. As disclosed in further detail below, in some embodiments of the present disclosure, a downhole drilling tool model (not expressly shown) may be used to select high efficiency downhole drilling tools (e.g., a drill bit, a reamer, a hole opener, etc.) from a group of available downhole drilling tools. In other embodiments, a downhole drilling tool model may be configured to select or optimize a design of a drill bit to increase drilling efficiency.

Accordingly, in some embodiments, drill bit 101 may be designed or manufactured in accordance with teachings of the present disclosure and may have different designs, configurations, and/or dimensions according to a particular application of drill bit 101. In some embodiments of the present disclosure, a downhole drilling tool model may be configured to analyze an efficiency of a downhole drilling tool by incorporating interactions between downhole drilling tools and rock chips. In other embodiments, the downhole drilling tool model may be configured to design or select a high efficiency downhole drilling tool based on a downhole drilling tool model including rock chip interactions associated with the downhole drilling tool. A downhole drilling tool model designed according to the present disclosure may improve accuracy of predictions of drilling efficiencies of downhole drilling tools.

Figure 2:
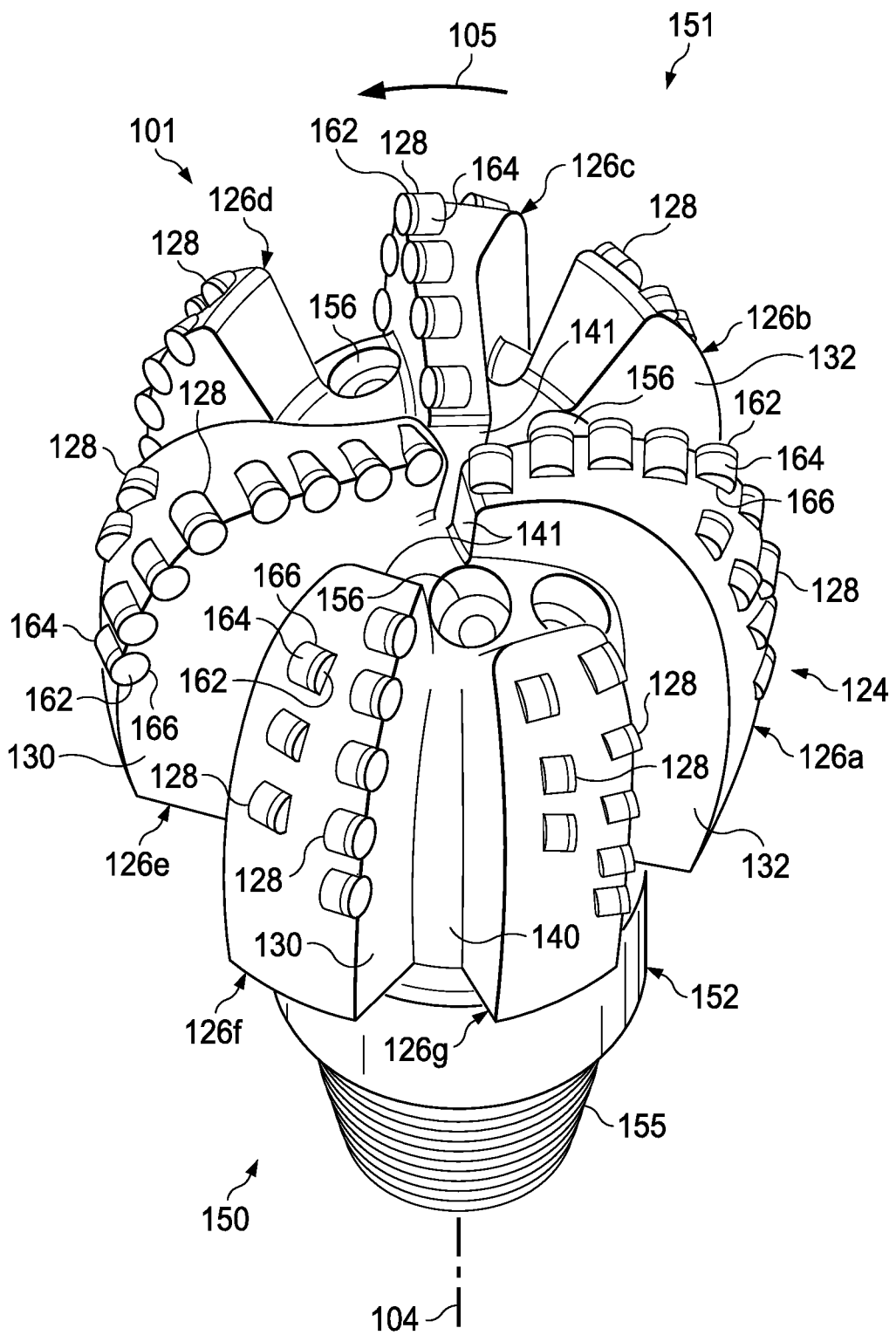
FIG. 2 illustrates an isometric view of a rotary drill bit oriented upwardly in a manner often used to model or design fixed cutter drill bits, in accordance with some embodiments of the present disclosure.

FIG. 2 illustrates an isometric view of rotary drill bit 101 oriented upwardly in a manner often used to model or design fixed cutter drill bits, in accordance with some embodiments of the present disclosure. Drill bit 101 may be any of various types of rotary drill bits, including fixed cutter drill bits, polycrystalline diamond compact (PDC) drill bits, drag bits, matrix drill bits, and/or steel body drill bits operable to form a wellbore (e.g., wellbore 114 as illustrated in FIG. 1) extending through one or more downhole formations. Drill bit 101 may be designed and formed in accordance with teachings of the present disclosure and may have many different designs, configurations, and/or dimensions according to the particular application of drill bit 101.

Drill bit 101 may include one or more blades 126 (e.g., blades 126a-126g) that may be disposed outwardly from exterior portions of rotary bit body 124 of drill bit 101. Blades 126 may be any suitable type of projections extending outwardly from rotary bit body 124. For example, a portion of blade 126 may be directly or indirectly coupled to an exterior portion of bit body 124, while another portion of blade 126 may be projected away from the exterior portion of bit body 124. Blades 126 formed in accordance with teachings of the present disclosure may have a wide variety of configurations including, but not limited to, substantially arched, generally helical, spiraling, tapered, converging, diverging, symmetrical, and/or asymmetrical. In some embodiments, one or more blades 126 may have a substantially arched configuration extending from proximate rotational axis 104 of drill bit 101. The arched configuration may be defined in part by a generally concave, recessed shaped portion extending from proximate bit rotational axis 104. The arched configuration may also be defined in part by a generally convex, outwardly curved portion disposed between the concave, recessed portion and exterior portions of each blade which correspond generally with the outside diameter of the rotary drill bit.

Each of blades 126 may include a first end disposed proximate or toward bit rotational axis 104 and a second end disposed proximate or toward exterior portions of drill bit 101 (e.g., disposed generally away from bit rotational axis 104 and toward uphole portions of drill bit 101). The terms "uphole" and "downhole" may be used to describe the location of various components of drilling system 100 relative to the bottom or end of wellbore 114 shown in FIG. 1. For example, a first component described as uphole from a second component may be further away from the end of wellbore 114 than the second component. Similarly, a first component described as being downhole from a second component may be located closer to the end of wellbore 114 than the second component.

Blades 126a-126g may include primary blades disposed about the bit rotational axis. For example, blades 126a, 126c, and 126e may be primary blades or major blades because respective first ends 141 of each of blades 126a, 126c, and 126e may be disposed closely adjacent to bit rotational axis 104 of drill bit 101. In some embodiments, blades 126a-126g may also include at least one secondary blade disposed between the primary blades. In the illustrated embodiment, blades 126b, 126d, 126f, and 126g on drill bit 101 may be secondary blades or minor blades because respective first ends 141 may be disposed on downhole end 151 of drill bit 101 a distance from associated bit rotational axis 104. The number and location of primary blades and secondary blades may vary such that drill bit 101 includes more or less primary and secondary blades. Blades 126 may be disposed symmetrically or asymmetrically with regard to each other and bit rotational axis 104 where the location of blades 126 may be based on the downhole drilling conditions of the drilling environment. In some embodiments, blades 126 and drill bit 101 may rotate about rotational axis 104 in a direction defined by directional arrow 105.

Each of blades 126 may have respective leading or front surfaces 130 in the direction of rotation of drill bit 101 and trailing or back surfaces 132 located opposite of leading surface 130 away from the direction of rotation of drill bit 101. In some embodiments, blades 126 may be positioned along bit body 124 such that they have a spiral configuration relative to bit rotational axis 104. In other embodiments, blades 126 may be positioned along bit body 124 in a generally parallel configuration with respect to each other and bit rotational axis 104.

Blades 126 may include one or more cutting elements 128 disposed outwardly from exterior portions of each blade 126. For example, a portion of cutting element 128 may be directly or indirectly coupled to an exterior portion of blade 126 while another portion of cutting element 128 may be projected away from the exterior portion of blade 126. By way of example and not limitation, cutting elements 128 may be various types of cutters, compacts, buttons, inserts, and gage cutters satisfactory for use with a wide variety of drill bits 101. Although FIG. 2 illustrates two rows of cutting elements 128 on blades 126, drill bits designed and manufactured in accordance with the teachings of the present disclosure may have one row of cutting elements or more than two rows of cutting elements.

Cutting elements 128 may be any suitable device configured to cut into a formation, including but not limited to, primary cutting elements, back-up cutting elements, secondary cutting elements or any combination thereof. Cutting elements 128 may include respective substrates 164 with a layer of hard cutting material (e.g., cutting table 162) disposed on one end of each respective substrate 164. The hard layer of cutting elements 128 may provide a cutting surface that may engage adjacent portions of a downhole formation to form wellbore 114 as illustrated in FIG. 1. The contact of the cutting surface with the formation may form a cutting zone associated with each of cutting elements 128, as described in further detail with respect to FIGS. 4A-4D. The edge of the cutting surface located within the cutting zone may be referred to as the cutting edge of a cutting element 128.

Each substrate 164 of cutting elements 128 may have various configurations and may be formed from tungsten carbide or other suitable materials associated with forming cutting elements for rotary drill bits. Tungsten carbides may include, but are not limited to, monotungsten carbide (WC), ditungsten carbide ($W_2C$), macrocrystalline tungsten carbide and cemented or sintered tungsten carbide. Substrates may also be formed using other hard materials, which may include various metal alloys and cements such as metal borides, metal carbides, metal oxides and metal nitrides. For some applications, the hard cutting layer may be formed from substantially the same materials as the substrate. In other applications, the hard cutting layer may be formed from different materials than the substrate. Examples of materials used to form hard cutting layers may include polycrystalline diamond materials, including synthetic polycrystalline diamonds. Blades 126 may include recesses or bit pockets 166 that may be configured to receive cutting elements 128. For example, bit pockets 166 may be concave cutouts on blades 126.

In some embodiments, blades 126 may also include one or more depth of cut controllers (DOCCs) (not expressly shown) configured to control the depth of cut of cutting elements 128. A DOCC may include an impact arrestor, a back-up or second layer cutting element and/or a Modified Diamond Reinforcement (MDR). Exterior portions of blades 126, cutting elements 128 and DOCCs (not expressly shown) may form portions of the bit face.

Blades 126 may further include one or more gage pads (not expressly shown) disposed on blades 126. A gage pad may be a gage, gage segment, or gage portion disposed on exterior portion of blade 126. Gage pads may contact adjacent portions of a wellbore (e.g., wellbore 114 as illustrated in FIG. 1) formed by drill bit 101. Exterior portions of blades 126 and/or associated gage pads may be disposed at various angles (e.g., positive, negative, and/or parallel) relative to adjacent portions of generally vertical wellbore 114a. A gage pad may include one or more layers of hardfacing material.

Uphole end 150 of drill bit 101 may include shank 152 with drill pipe threads 155 formed thereon. Threads 155 may be used to releasably engage drill bit 101 with BHA 120 whereby drill bit 101 may be rotated relative to bit rotational axis 104. Downhole end 151 of drill bit 101 may include a plurality of blades 126a-126g with respective junk slots or fluid flow paths 140 disposed therebetween. Additionally, drilling fluids may be communicated to one or more nozzles 156.

Drill bit operation may be expressed in terms of depth of cut per revolution as a function of drilling depth. Depth of cut per revolution, or "depth of cut," may be determined by rate of penetration (ROP) and revolution per minute (RPM). ROP may represent the amount of formation that is removed as drill bit 101 rotates and may be in units of ft/hr. Further, RPM may represent the rotational speed of drill bit 101. For example, drill bit 101 utilized to drill a formation may rotate at approximately 120 RPM. Actual depth of cut ($\Delta$) may represent a measure of the depth that cutting elements cut into the formation during a rotation of drill bit 101. Thus, actual depth of cut may be expressed as a function of actual ROP and RPM using the following equation:

$$\Delta = ROP/(5*RPM).$$

Actual depth of cut may have a unit of in/rev.

The rate of penetration (ROP) of drill bit 101 is often a function of both weight on bit (WOB) and revolutions per minute (RPM). Drill string 103 may apply weight on drill bit 101 and may also rotate drill bit 101 about rotational axis 104 to form a wellbore 114 (e.g., wellbore 114a or wellbore 114b). For some applications a downhole motor (not expressly shown) may be provided as part of BHA 120 to also rotate drill bit 101. In some embodiments, the drilling efficiency of drill bit 101 may depend on the location or configuration of cutting elements 128 or blades 126. Accordingly, a downhole drilling tool model may take into consideration the location, orientation and configuration cutting elements 128, blades 126, or other components of drill bit 101 in order to model interactions of downhole drilling tools with formations.

Figure 3A:
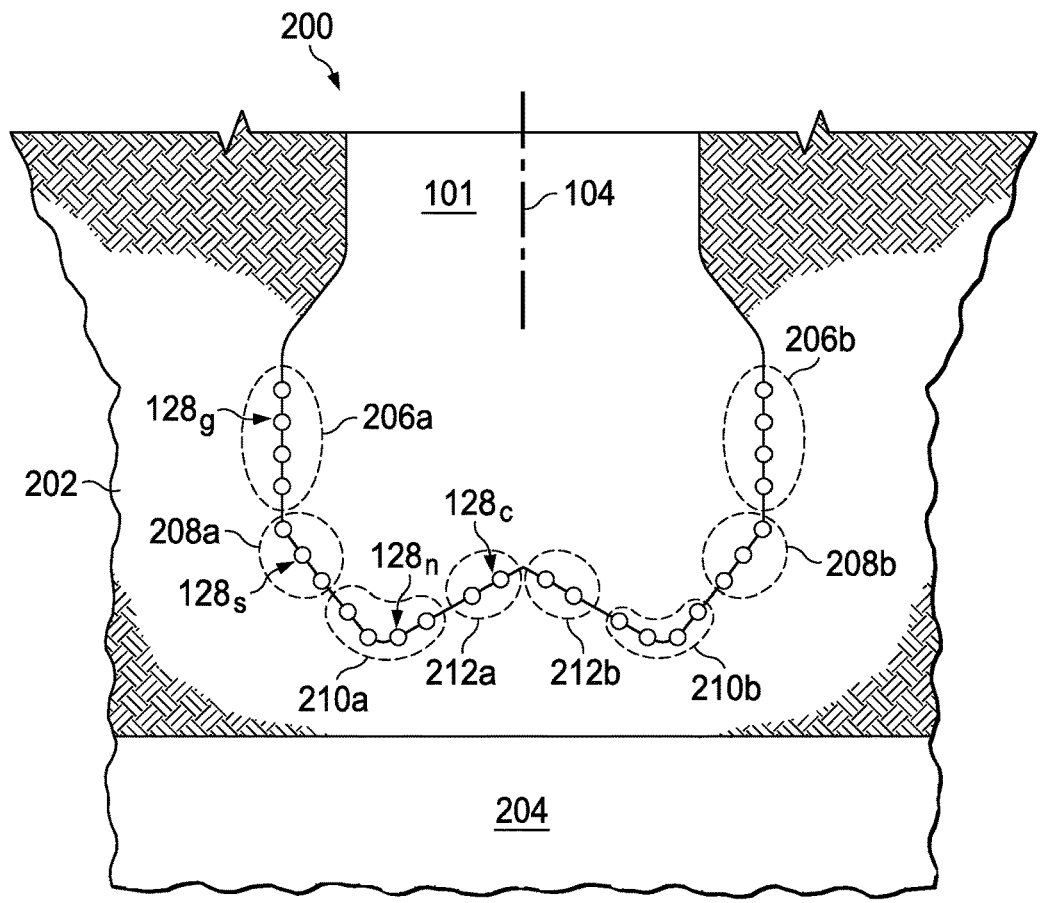
FIG. 3A illustrates a drawing in section and in elevation with portions broken away showing the drill bit of FIG. 2 drilling a wellbore through a first downhole formation and into an adjacent second downhole formation, in accordance with some embodiments of the present disclosure.

FIG. 3A illustrates a drawing in section and in elevation with portions broken away showing drill bit 101 of FIG. 2 drilling a wellbore through a first downhole formation and into an adjacent second downhole formation, in accordance with some embodiments of the present disclosure. Exterior portions of blades (not expressly shown) and cutting elements 128 may be projected rotationally onto a radial plane to form bit face profile 200. In the illustrated embodiment, formation layer 202 may be described as "softer" or "less hard" when compared to downhole formation layer 204. As shown in FIG. 3A, exterior portions of drill bit 101 that contact adjacent portions of a downhole formation may be described as a "bit face." Bit face profile 200 of drill bit 101 may include various zones or segments. Bit face profile 200 may be substantially symmetric about bit rotational axis 104 due to the rotational projection of bit face profile 200, such that the zones or segments on one side of rotational axis 104 may be substantially similar to the zones or segments on the opposite side of rotational axis 104.

For example, bit face profile 200 may include a gage zone 206a located opposite a gage zone 206b, a shoulder zone 208a located opposite a shoulder zone 208b, a nose zone 210a located opposite a nose zone 210b, and a cone zone 212a located opposite a cone zone 212b. The cutting elements 128 included in each zone may be referred to as cutting elements of that zone. For example, cutting elements 128$_g$ included in gage zones 206 may be referred to as gage cutting elements, cutting elements 128$_s$ included in shoulder zones 208 may be referred to as shoulder cutting elements, cutting elements 128$_n$ included in nose zones 210 may be referred to as nose cutting elements, and cutting elements 128$_c$ included in cone zones 212 may be referred to as cone cutting elements.

Cone zones 212 may be generally convex and may be formed on exterior portions of each blade (e.g., blades 126 as illustrated in FIG. 1) of drill bit 101, adjacent to and extending out from bit rotational axis 104. Nose zones 210 may be generally convex and may be formed on exterior portions of each blade of drill bit 101, adjacent to and extending from each cone zone 212. Shoulder zones 208 may be formed on exterior portions of each blade 126 extending from respective nose zones 210 and may terminate proximate to a respective gage zone 206. As shown in FIG. 3A, the area of bit face profile 200 may depend on cross-sectional areas associated with zones or segments of bit face profile 200 rather than on a total number of cutting elements, a total number of blades, or cutting areas per cutting element.

Figure 3B:
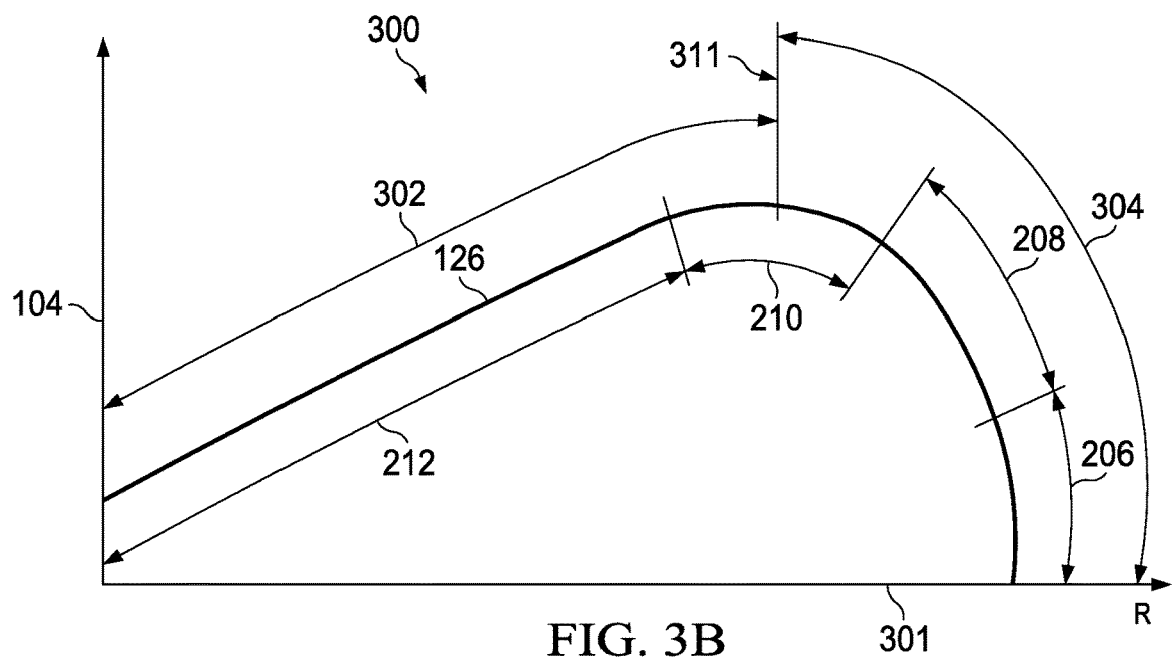
FIG. 3B illustrates a blade profile that represents a cross-sectional view of a blade of a drill bit, in accordance with some embodiments of the present disclosure.

FIG. 3B illustrates blade profile 300 that represents a cross-sectional view of blade 126 of drill bit 101, in accordance with some embodiments of the present disclosure. Blade profile 300 includes cone zone 212, nose zone 210, shoulder zone 208 and gage zone 206 as described above with respect to FIG. 2. Cone zone 212, nose zone 210, shoulder zone 208 and gage zone 206 may be based on their location along blade 126 with respect to rotational axis 104 and horizontal reference line 301 that indicates a distance from rotational axis 104 in a plane perpendicular to rotational axis 104. A comparison of FIGS. 3A and 3B shows that blade profile 300 of FIG. 3B is upside down with respect to bit face profile 200 of FIG. 3A.

Blade profile 300 may include inner zone 302 and outer zone 304. Inner zone 302 may extend outward from rotational axis 104 to nose point 311. Outer zone 304 may extend from nose point 311 to the end of blade 126. Nose point 311 may be the location on blade profile 300 within nose zone 210 that has maximum elevation as measured by bit rotational axis 104 (vertical axis) from reference line 301 (horizontal axis). A coordinate on the graph in FIG. 3B corresponding to rotational axis 104 may be referred to as an axial coordinate or position. A coordinate on the graph in FIG. 3B corresponding to reference line 301 may be referred to as a radial coordinate or radial position that may indicate a distance extending orthogonally from rotational axis 104 in a radial plane passing through rotational axis 104. For example, in FIG. 3B rotational axis 104 may be placed along a z-axis and reference line 301 may indicate the distance (R) extending orthogonally from rotational axis 104 to a point on a radial plane that may be defined as the ZR plane.

FIGS. 3A and 3B are for illustrative purposes only and modifications, additions or omissions may be made to FIGS. 3A and 3B without departing from the scope of the present disclosure. For example, the actual locations of the various zones with respect to the bit face profile may vary and may not be exactly as depicted.

FIGS. 4A-4D illustrate cutting edges 406 and cutting zones 404 of various cutting elements 402 disposed along a blade 400, as modeled by a downhole drilling tool model. The location and size of cutting zones 404 (and consequently the location and size of cutting edges 406) may depend on factors including the ROP and RPM of the bit, the size of cutting elements 402, and the location and orientation of cutting elements 402 along the blade profile of blade 400, and accordingly the bit face profile of the drill bit.

Figure 4A:
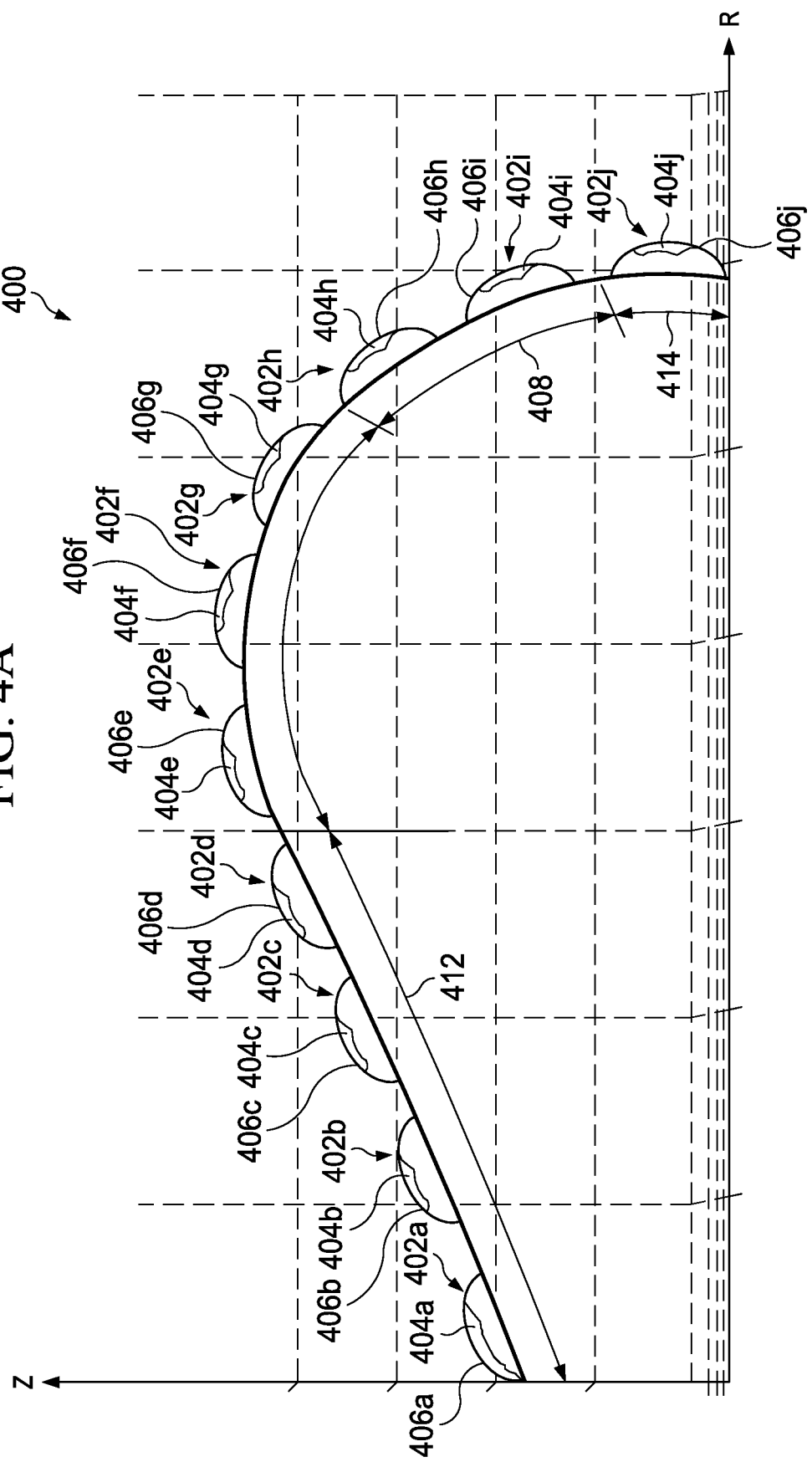
FIGS. 4A-4D illustrate cutting zones of various cutting elements disposed along a blade, in accordance with some embodiments of the present disclosure.

FIG. 4A illustrates a graph of a profile of blade 400 indicating radial and axial locations of cutting elements 402a-402j along blade 400. The vertical axis ("Z") depicts the axial position of blade 400 along a bit rotational axis and the horizontal axis ("R") depicts the radial position of blade 400 from the bit rotational axis in a radial plane passing through the bit rotational axis. Blade 400 may be substantially similar to one of blades 126 described with respect to FIGS. 1-3 and cutting elements 402 may be substantially similar to cutting elements 128 described with respect to FIGS. 1-3. In the illustrated embodiment, cutting elements 402a-402d may be located within a cone zone 412 of blade 400 and cutting elements 402e-402g may be located within a nose zone 410 of blade 400. Additionally, cutting elements 402h-402i may be located within a shoulder zone 408 of blade 400 and cutting element 402j may be located within a gage zone 414 of blade 400. Cone zone 412, nose zone 410, shoulder zone 408 and gage zone 414 may be substantially similar to cone zone 212, nose zone 210, shoulder zone 208 and gage zone 206, respectively, described with respect to FIGS. 3A and 3B.

FIG. 4A illustrates cutting zones 404a-404j, with each cutting zone 404 corresponding with a respective cutting element 402. As mentioned above, each cutting element 402 may have a cutting edge (not expressly shown) located within a cutting zone 404. From FIG. 4A it can be seen that the cutting zone 404 of each cutting element 402 may be based on the axial and radial locations of the cutting element 402 on blade 400, which may be related to the various zones of blade 400.

Figure 4B:
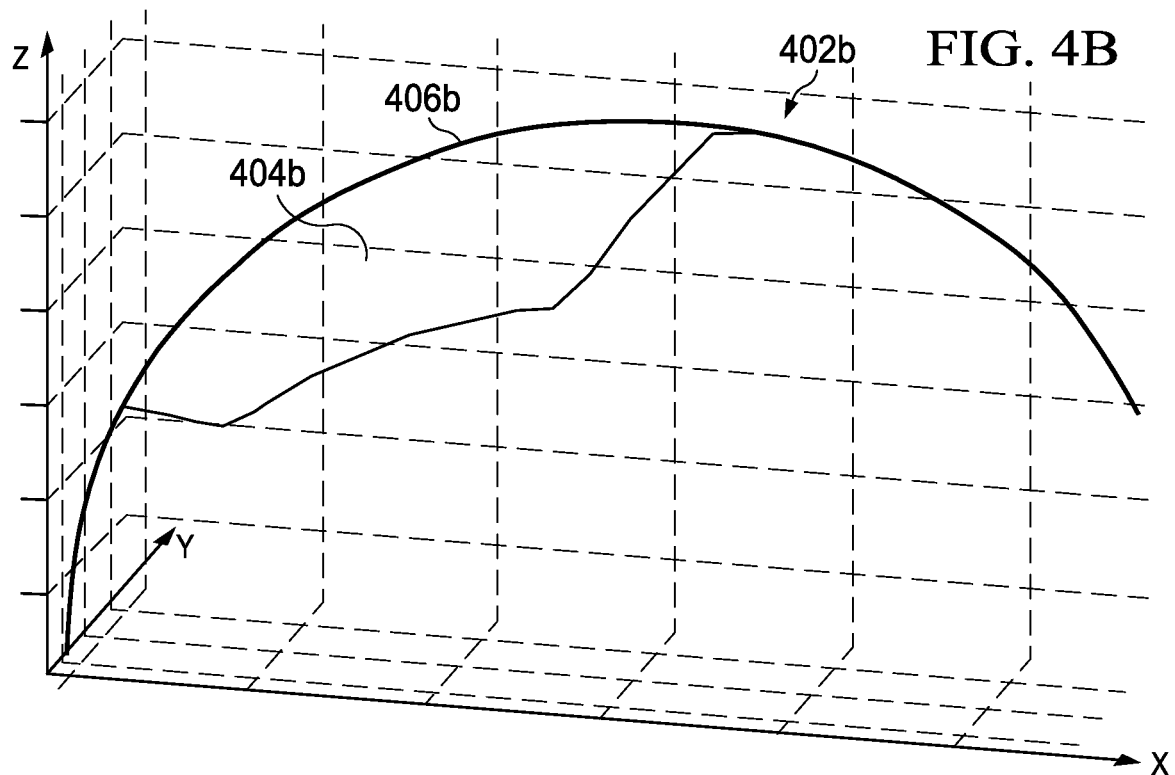

FIG. 4B illustrates an exploded graph of cutting element 402b of FIG. 4A to further detail cutting zone 404b and cutting edge 406b associated with cutting element 402b. From FIG. 4A it can be seen that cutting element 402b may be located in cone zone 412. Cutting zone 404b may be based at least partially on cutting element 402b being located in cone zone 412 and having axial and radial positions corresponding with cone zone 412. As mentioned above, cutting edge 406b may be the edge of the cutting surface of cutting element 402b that is located within cutting zone 404b.

Figure 4C:
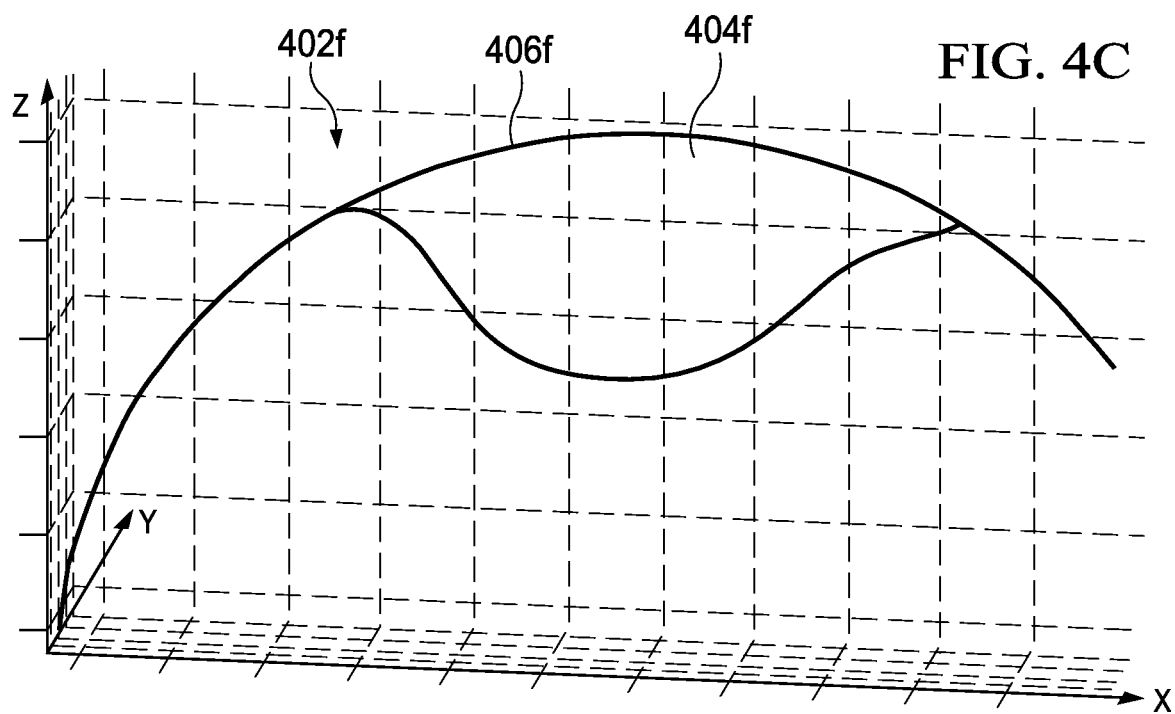

FIG. 4C illustrates an exploded graph of cutting element 402f of FIG. 4A to further detail cutting zone 404f and cutting edge 406f associated with cutting element 402f. From FIG. 4A it can be seen that cutting element 402f may be located in nose zone 410. Cutting zone 404f may be based at least partially on cutting element 402f being located in nose zone 410 and having axial and radial positions corresponding with nose zone 410.

Figure 4D:
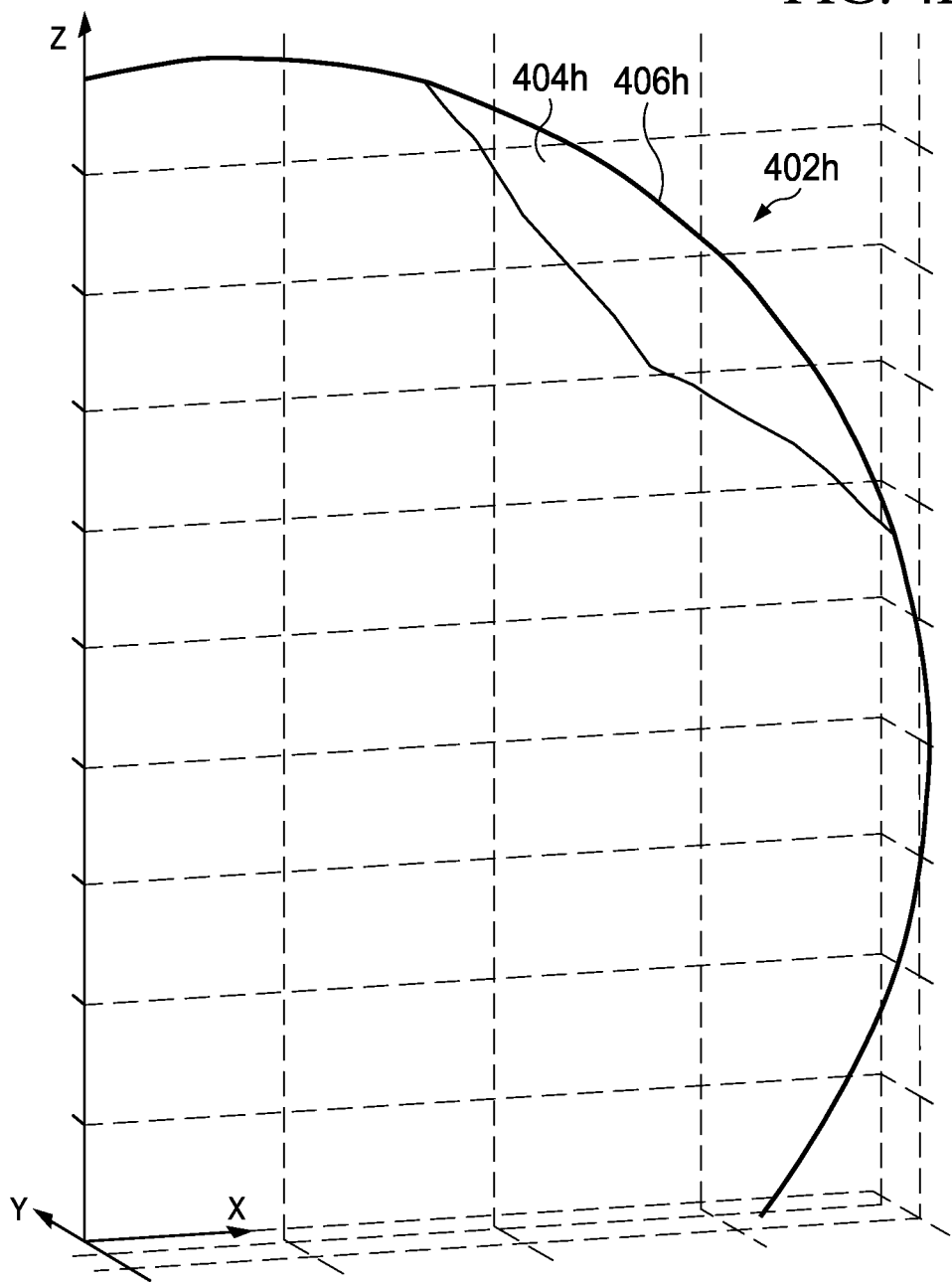

FIG. 4D illustrates an exploded graph of cutting element 402h of FIG. 4A to further detail cutting zone 404h and cutting edge 406h associated with cutting element 402h. From FIG. 4A it can be seen that cutting element 402h may be located in shoulder zone 408. Cutting zone 404h may be based partially on cutting element 402h being located in shoulder zone 408 and having axial and radial positions corresponding with shoulder zone 408.

An analysis of FIG. 4A and a comparison of FIGS. 4B-4D reveal that the locations of cutting zones 404 of cutting elements 402 may vary at least in part on the axial and radial positions of cutting elements 402 with respect to rotational axis 104. Accordingly, a downhole drilling tool model may take into consideration the location, orientation and configuration cutting elements 402 of a drill bit in order to incorporate interactions of downhole drilling tools with formations.

Figure 5A:
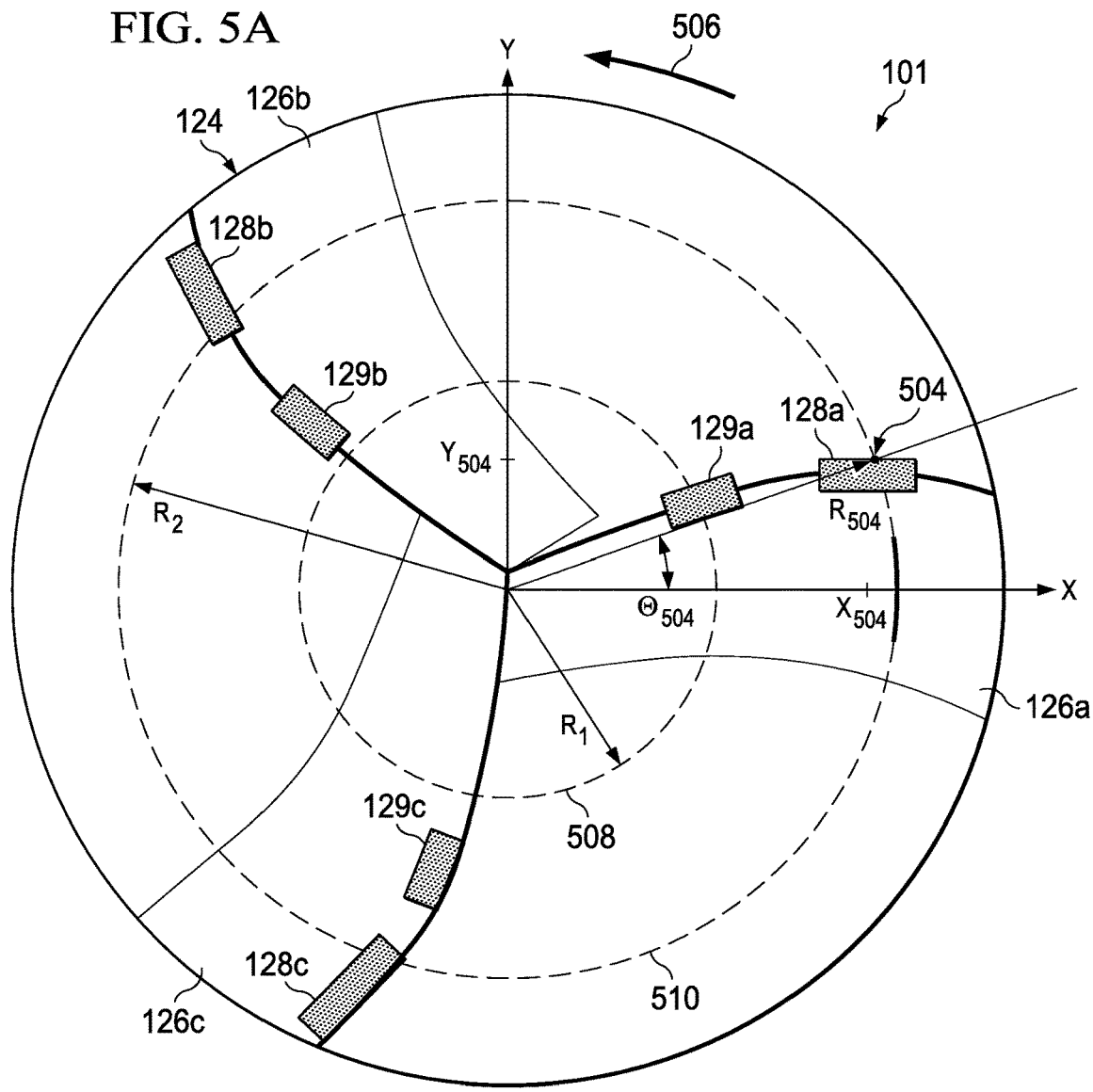
FIG. 5A is a top view of the drill bit 101 illustrating the face of a drill bit that may be designed and manufactured to provide an improved depth of cut control, in accordance with some embodiments of the present disclosure.
Figure 5B:
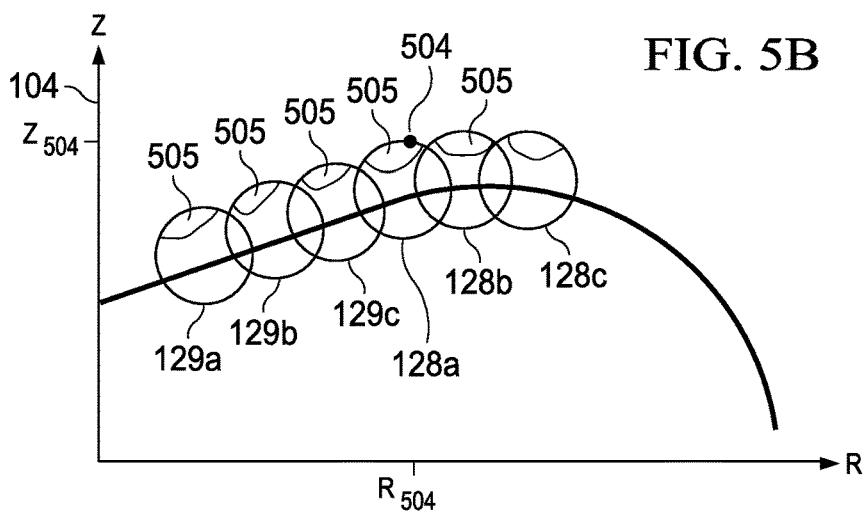
FIG. 5B illustrates the locations of cutting elements of the drill bit of FIG. 5A along the bit profile of the drill bit, in accordance with some embodiments of the present disclosure.

FIG. 5A is a top view of the drill bit 101 illustrating the face of a drill bit that may be designed and manufactured to provide an improved depth of cut control, in accordance with some embodiments of the present disclosure. FIG. 5B illustrates the locations of cutting elements of the drill bit of FIG. 5A along the bit profile of the drill bit, in accordance with some embodiments of the present disclosure;

To provide a frame of reference, FIG. 5A includes an x-axis and a y-axis and FIG. 5B includes a z-axis that may be associated with rotational axis 104 of drill bit 101 and a radial axis (R) that indicates the orthogonal distance from the center of bit 101 in the xy plane. Accordingly, a coordinate or position corresponding to the z-axis may be referred to as an axial coordinate or axial position of the bit face profile. Additionally, a location along the bit face may be described by x and y coordinates of an xy-plane substantially perpendicular to the z-axis. The distance from the center of bit 101 (e.g., rotational axis 104) to a point in the xy plane of the bit face may indicate the radial coordinate or radial position of the point on the bit face profile of bit 101. For example, the radial coordinate, r, of a point in the xy plane having an x coordinate, x, and a y coordinate, y, may be expressed by the following equation:

$$r = \sqrt{x^2 + y^2}$$

Additionally, a point in the xy plane may have an angular coordinate that may be an angle between a line extending from the center of bit 101 (e.g., rotational axis 104) to the point and the x-axis. For example, the angular coordinate (θ) of a point in the xy plane having an x-coordinate, x, and a y-coordinate, y, may be expressed by the following equation:

$$\theta = \arctan(y/x)$$

As a further example, a point 504 located on the cutting edge of cutting element 128a (as depicted in FIGS. 5A and 5B) may have an x-coordinate ($X_{504}$) and a y-coordinate ($Y_{504}$) in the xy plane that may be used to calculate a radial coordinate ($R_{504}$) of point 504 (e.g., $R_{504}$ may be equal to the square root of $X_{504}$ squared plus $Y_{504}$ squared). $R_{504}$ may accordingly indicate an orthogonal distance of point 504 from rotational axis 104. Additionally, point 504 may have an angular coordinate ($\theta_{504}$) that may be the angle between the x-axis and the line extending from rotational axis 104 to point 504 (e.g., $\theta_{504}$ may be equal to arctan ($X_{504}/Y_{504}$)). Further, as depicted in FIG. 5B, point 504 may have an axial coordinate ($Z_{504}$) that may represent a position along the z-axis that may correspond to point 504. It is understood that the coordinates are used for illustrative purposes only, and that any other suitable coordinate system or configuration, may be used to provide a frame of reference of points along the bit face and bit face profile of drill bit 101. Additionally, any suitable units may be used. For example, the angular position may be expressed in degrees or in radians.

Drill bit 101 may include bit body 124 with a plurality of blades 126 positioned along bit body 124. In the illustrated embodiment, drill bit 101 may include blades 126a-126c, however it is understood that in other embodiments, drill bit 101 may include more or fewer blades 126. Blades 126 may include outer cutting elements 128 and inner cutting elements 129 disposed along blades 126. For example, blade 126a may include outer cutting element 128a and inner cutting element 129a, blade 126b may include outer cutting element 128b and inner cutting element 129b and blade 126c may include outer cutting element 128c and inner cutting element 129c.

As drill bit 101 rotates, cutting elements 128 and 129 may follow a rotational path indicated by radial paths 508 and 510 of drill bit 101. Radial paths 508 and 510 may be defined by radial coordinates $R_1$ and $R_2$. $R_1$ may indicate the orthogonal distance from rotational axis 104 to the centers of cutting elements 129 (with respect to the center of drill bit 101). $R_2$ may indicate the orthogonal distance from rotational axis 104 to the centers of cutting elements 128 (with respect to the center of drill bit 101).

Modifications, additions or omissions may be made to FIGS. 5A and 5B without departing from the scope of the present disclosure. For example, the number of blades 126 and cutting elements 128 may vary according to the various design constraints and considerations of drill bit 101.

Figure 6A:
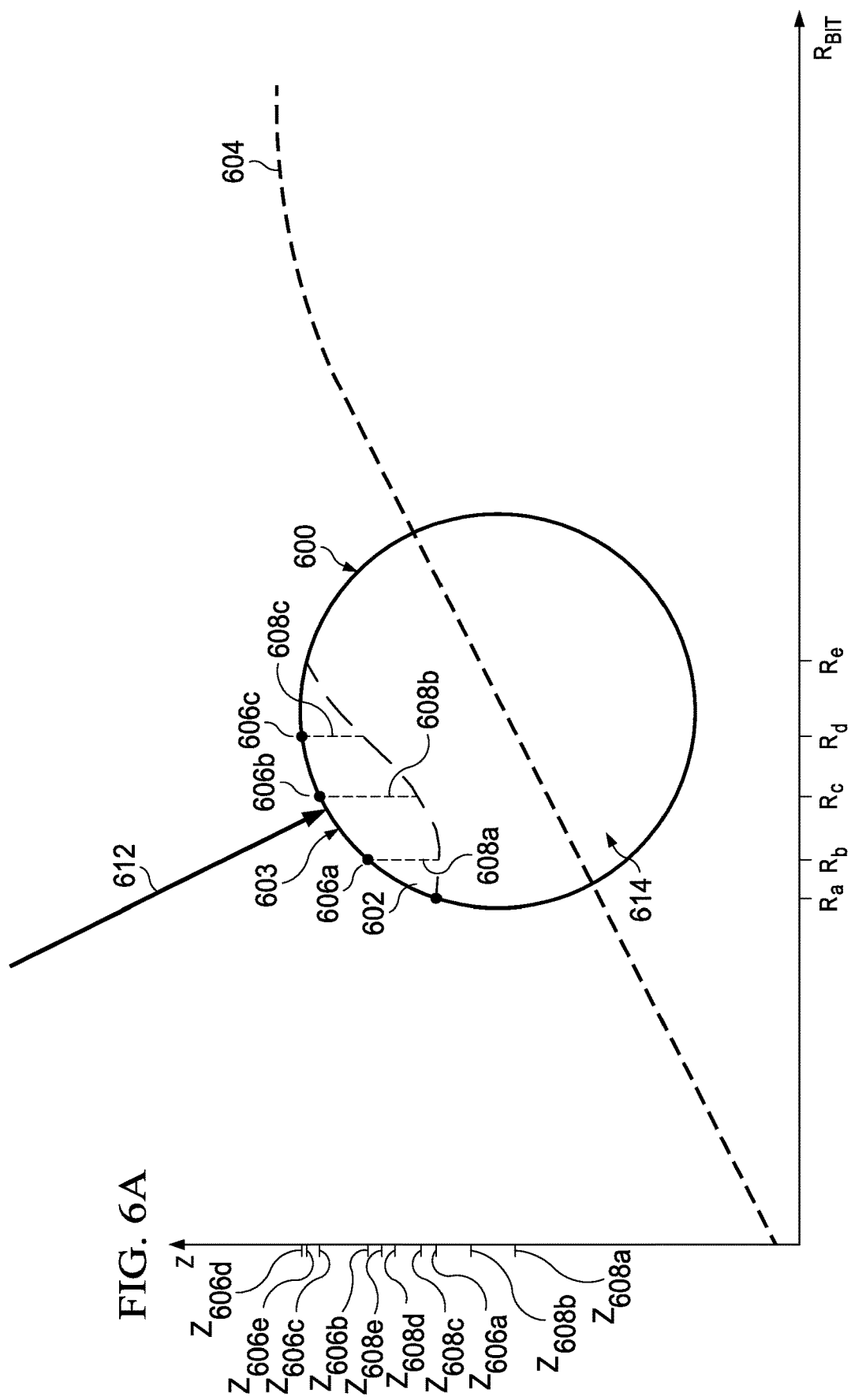
FIG. 6A illustrates a graph of a bit face profile of a cutting element, in accordance with some embodiments of the present disclosure.

FIG. 6A illustrates a graph of a bit face profile of a cutting element 600 in accordance with some embodiments of the present disclosure. The coordinate system used in FIG. 6A may be substantially similar to that described with respect to FIGS. 5A and 5B. Therefore, the rotational axis of the drill bit corresponding with FIG. 6A may be associated with the z-axis of a Cartesian coordinate system to define an axial position with respect to the drill bit. Additionally, an xy plane of the coordinate system may correspond with a plane of the bit face of the drill bit that is substantially perpendicular to the rotational axis. Coordinates on the xy plane may be used to define radial and angular coordinates associated with the drill bit of FIG. 6A.

FIG. 6A illustrates the axial and radial coordinates of cutting element 600 and cutting zone 602 (and its associated cutting edge 603) of cutting element 600. Cutting edge 603 of cutting element 600 that corresponds with cutting zone 602 may be divided according to cutlets 606a-606c that have radial and axial positions as depicted in FIG. 6A. Each cutlet may have an associated depth of cut 608a-608c.

Figure 6B:
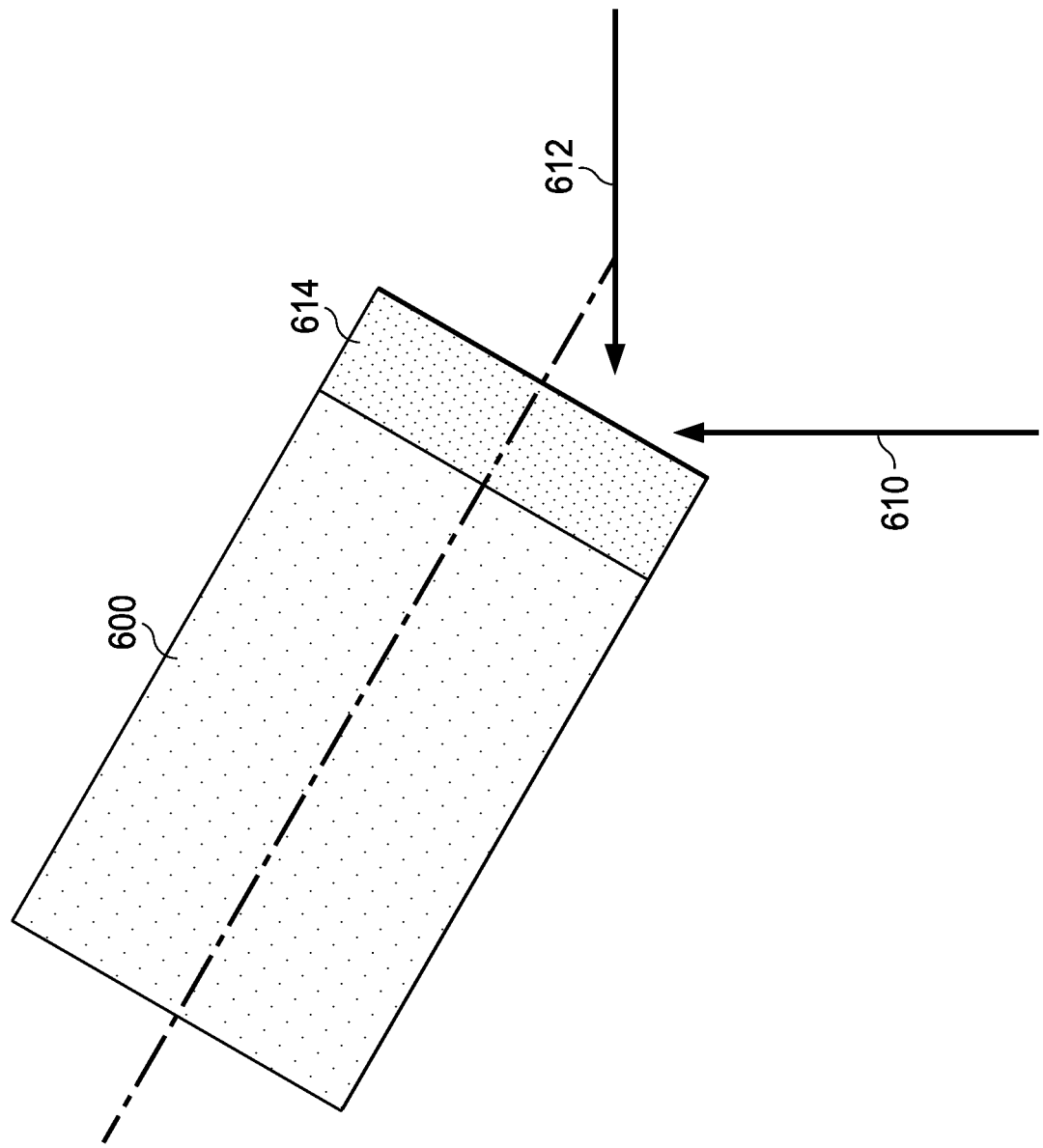
FIG. 6B illustrates a cross sectional view of an exemplary cutting element, including associated drilling forces, in accordance with some embodiments of the present disclosure.

In accordance with some embodiments of the present disclosure, downhole drilling tool models may be used to model efficiency of drill bits. Downhole drilling tool models may calculate at least two forces acting on each cutting element: drag force ($F_d$) and penetration force ($F_p$). FIG. 6B illustrates a cross sectional view of an exemplary cutting element, including associated drilling forces, in accordance with some embodiments of the present disclosure. As shown in FIGS. 6A and 6B, penetration force 610 may act in the direction of bit axis. As shown in FIG. 6B, drag force 612 may act perpendicularly to penetration force 610, in the direction of cutting face 614. Drag force 612 and penetration force 610 may depend on cutting element geometry coefficients ($K_d$) and ($K_p$), which may be functions of a back rake angle, side rake angle and profile angle of cutting element 600. Further, drag force 612 and penetration force 610 may additionally depend on rock compressive strength ($\sigma$) and area (A) of cutting zone 602. Drag force 612 and penetration force 610 may be calculated as expressed by the equations:

$$F_d = K_d * \sigma * A$$

$$F_p = K_p * \sigma * A$$

However, in some embodiments, more complex models may be required if, for example, cutting areas of cutting elements, cutting element geometry coefficients, or rock compressive strength at the location of a cutting element vary between cutting elements. For example, a downhole drilling tool model may, receive as inputs (typically as an ASCII file) a description of cutting elements locations, cutlet locations, rake angles, formation compressive strength, rate of penetration (ROP), weight on bit (WOB), and/or rotations per minute (RPM). In some embodiments, downhole drilling tool models may utilize an integration method for developing cutting element engagement geometries and bottom hole pattern, taking into account locations of each cutting element 600 and cutlet 606 in a three dimensional coordinate system. Once an engagement of each cutlet 606 has been determined across an drill bit face, drag forces and penetration forces may be calculated and summed for each individual cutting element. Vertical components of forces may be summed to estimate WOB. Drag forces may be multiplied by their respective moment arms to compute bit torque (TOB).

Additionally, models of drilling efficiency of a drill bit may be evaluated in terms of mechanical specific energy ($E_s$). A drill bit with a lower mechanical specific energy may be referred to as a more efficient drill bit. Mechanical specific energy of a drilling bit may be expressed as a function of WOB, TOB, RPM and ROP, and borehole cross-sectional area ($A_{bh}$) by the following equation:

$$E_s = WOB/A_{bh} + 120 * \pi * RPM * TOB/(A_{bh} * ROP)$$

Accordingly, a downhole drilling tool model configured to calculate WOB and TOB may enable accurate modeling of mechanical specific energy, and consequently drill bit efficiency. Thus, according to teachings of the present disclosure, a downhole drilling tool model capable of modeling mechanical specific energy may be implemented.

Modifications, additions or omissions may be made to FIG. 6 without departing from the scope of the present disclosure. Although a specific number of cutlets and depths of cut are described, it is understood that any appropriate number may be used to configure analyze an efficiency of a cutting element or a drill bit.

FIG. 7 illustrates a cross sectional view of an exemplary cutting element 704 engaged with geophysical formation 702, in accordance with some embodiments of the present disclosure. As a drill bit, such as drill bit 101 discussed above with reference to FIG. 1, rotates around a rotational axis, cutting elements, such as cutting element 704, may contact a formation, such as formation 702. Rotation of drill bit 101 may apply forces to cutting element 704 that cause the cutting element to move across formation 702 laterally in direction 710. Direction 710 may lie in a plane substantially perpendicular to the bit rotational axis. As cutting element 704 engages with formation 702 by moving in direction 710, material in area 712 may be removed by cutting face 706 of cutting element 704.

Further, engagement of cutting element 704 with formation 702 may also remove material in front of cutting face 706. For example, the interaction of cutting element 704 with formation 702 may cause rock chip 708 to separate from formation 702. Rock chip 708 may be demarcated by crack trajectory 718. Crack trajectory 718 may begin at a point, corresponding to cutlet 724, along a cutting edge of cutting face 706. Crack trajectory 718 may follow a generally parabolic path to surface 726 of formation 702, reaching surface 726 at chip end 728. The shape of crack trajectory 718 may be based on a variety of factors. For example, the shape of crack trajectory 718 may depend on depth of cut of cutting element 704, the initial angle of crack trajectory 718 from cutting face 706, confining pressure, mud pressure, rock shear strength, whether formation 702 is in a brittle or ductile mode, or any other suitable drilling parameter or property of formation 702.

As depicted in FIG. 7, cutlet 724 may have depth of cut 714 ($\delta_{714}$). Each cutlet associated with a cutting zone of a cutting element, such as cutlets 606a-606c (as discussed above with reference to FIG. 6), may have a different depth of cut. Thus, each cutlet associated with a cutting element may have a different associated crack trajectory, and consequently may be associated with a different size of rock chip.

Because a particular drill bit may have a large number of cutting elements, each with a number of associated cutlets, it may be computationally intensive to model a parabolic crack trajectory for each rock chip. Accordingly, in some embodiments, crack trajectories may be modeled as straight lines. FIG. 8 illustrates a modeled approximation of rock chip 808 in accordance with some embodiments of the present disclosure. Although a crack trajectory may have a generally parabolic shape, a rock chip may be modeled as having a triangular shape, such as, for example, modeled rock chip 808. For example, modeled rock chip 808 may have an associated modeled rock chip boundary 818. Modeled rock chip boundary 818 may be a straight line between cutlet 824 and rock chip end 828. By modeling a rock chip in this manner, instances of modeled rock chip 808 may be characterized by modeled depth of cut 814 and modeled rock chip angle 820. Modeled depth of cut 814 may be the distance along a line perpendicular to surface 826 between cutlet 824 and a line extending along surface 826 of formation 802. Modeled rock chip angle 820 may be the angle formed between modeled crack trajectory 818 and surface 826.

Under a given set of drilling parameters, rock chips may have similar rock chip angles. Thus, for a given set of drilling parameters, such as confining pressure, mud pressure, rock shear strength, depth of cut of a cutting element or any other suitable drilling parameter, each rock chip may be assumed to have the same modeled rock chip angle. Modeled rock chip angle 820 ($\psi$) may be empirically determined from lab tests or field tests by operating a drill bit under a variety of drilling parameters and collecting and measuring rock chips. For example, chip length 822 (L) and chip height 810 ($\delta_c$) may be measured. In some embodiments, chip height 810 may be calculated based upon depth of cut 814 ($\delta$) of an associated cutlet, back rake angle 816 ($\beta$), and modeled rock chip angle 820 ($\psi$). Accordingly, modeled rock chip angle 820 ($\psi$) may be expressed by the following equation:

$$\psi = \arctan(\delta_c/L)$$

However, rock chips may only be created when depth of cut 814 is greater than a critical depth of cut. Critical depth of cut may depend on confining pressure, mud pressure, rock shear strength, or any other suitable drilling parameter or formation property. Critical depth of cut may numerically be modeled or observed in laboratory or field testing. In some embodiments, a critical depth of cut may be determined by analysis of a distribution of measured chip heights. A critical depth of cut may be estimated, for example, by determining the smallest chip height, a first quartile of chip heights, a chip height corresponding to three standard deviations below the mean chip height, or any other suitable method of analyzing a distribution of measured chip heights.

Once the properties of two dimensional rock chips, such as modeled rock chip 808 (discussed above with reference to FIG. 8), have been determined, three dimensional rock chips may be modeled. As cutting elements engage with formations, three dimensional rock chips of varying sizes may separate from formations in advance of the cutting edges of the cutting elements. Variations in sizes of rock chips may correlate with variations in the depth of cut associated with different cutlets of the cutting elements. For example, each cutlet associated with a cutting element may have a different depth of cut. Accordingly, as described with reference to FIGS. 7 and 8, cutlets may be associated with two dimensional rock chips of varying sizes. In accordance with some embodiments of the present disclosure, three dimensional rock chips may be modeled as aggregations of these two dimensional rock chips associated with cutlets of a cutting element. Thus, in some embodiments, three dimensional rock chips may consist of groups of adjacent two dimensional rock chips associated with cutlets of a cutting element.

FIGS. 9A and 9B illustrate an exemplary modeled three dimensional rock chip in accordance with some embodiments of the present disclosure. FIG. 9A illustrates a three dimensional rock chip divided into an exemplary group of cutlets, in accordance with some embodiments of the present disclosure. In some embodiments, two or more cutlets associated with a cutting area of a cutting element may generate rock chips of varying sizes according to a depth of cut. For example, cutting element 902, as shown in FIG. 9A, may include cutting zone 908. Cutting zone 908 may include any number of cutlets 904a-904k. Each cutlet 904a-904k may include an associated depth of cut ($\delta$). Under a particular set of drilling parameters, critical depth of cut 910 may be determined. Accordingly, if any depth of cut of cutlets 904a-904k is greater than critical depth of cut 910, two dimensional rock chips may be formed when cutting element 902 contacts a formation during a drilling operation. In some embodiments, rock chips associated with cutlets 904a-904k may be modeled as two dimensional rock chips as previously discussed in conjunction with FIGS. 7 and 8. For example, for a particular cutting element, if the maximum modeled depth of cut associated with cutlets 904a-904k is less than critical depth of cut 910, no two dimensional rock chips associated with cutting element 902 may be modeled. Alternatively, if the maximum modeled depth of cut associated with a particular cutting element 902 is greater than critical cutting depth 910, a rock chip associated with each particular cutlets 904a-904k may be modeled.

FIG. 9B illustrates exemplary two dimensional rock chip lengths for an associated three dimensional rock chip in accordance with some embodiments of the present disclosure. As shown in FIG. 9A, exemplary cutlets 904a, 904j and 904k include an associated depth of cut less than critical depth of cut 910. Accordingly, cutlets 904a, 904j and 904k do not have associated modeled rock chip lengths. As further shown in FIG. 9A, cutlets 904b-904i include an associated depth of cut greater than critical depth of cut 910. Accordingly, rock chips associated with cutlets 904b-904i include associated modeled rock chip lengths 906b-906i. Modeled rock chip lengths 906b-906i may extend substantially perpendicularly from cutting face 912 of cutting element 902. Alternatively, if the modeled depth of cut associated with a particular cutlet 904 is greater than critical depth of cut 910, modeled rock chip lengths 906b-906i ($L_x$) may be calculated for a particular set of drilling parameters as a function of chip height ($\delta_x$) and rock chip angle ($\psi$), as expressed by the following equation:

$$L_x = \delta_x / \tan(\psi)$$

After rock chips associated with cutlets 904b-904i are modeled as extending from cutting face 912, three dimensional areas encompassing groups of adjacent two dimensional rock chips may be referred to as three dimensional rock chips. A combination of a set of two dimensional rock chips associated with cutlets of a single cutting element may be referred to as a three dimensional rock chip.

In some embodiments of the present disclosure, three dimensional rock chips associated with cutting elements of a drill bit may be incorporated into a downhole drilling tool model. A model of an initial borehole bottom may be generated by modeling a full revolution of a drill bit without axial penetration. Subsequently, in some embodiments, the borehole bottom may be divided into a grid using a polar coordinate system. In some embodiments, the grid may be formed using constant steps ($d_r$) in the radial direction, and constant steps ($d_\theta$) in the circumferential direction. Each grid point may include an associated formation height measured along a z-axis that may be associated with rotational axis of a drill bit, such as the z-axis shown in FIG. 5. The interactions of a drill bit with a formation may be analyzed by modeling incremental rotations of the drill bit around a rotational axis in discrete time steps. In some embodiments, the rotational axis may be the bit rotational axis, such as bit rotational axis 104, discussed with reference to FIGS. 1, 2 and 3A. In other embodiments, a drill bit may rotate around any other suitable axis. For example, at each incremental time step, locations of each cutting elements and associated cutlets may be updated. If an updated location of a cutlet indicates that the cutlet cuts into the borehole bottom during a time step, the associated formation height may be updated according to the depth of the cut of the cutlet.

Figure 10:
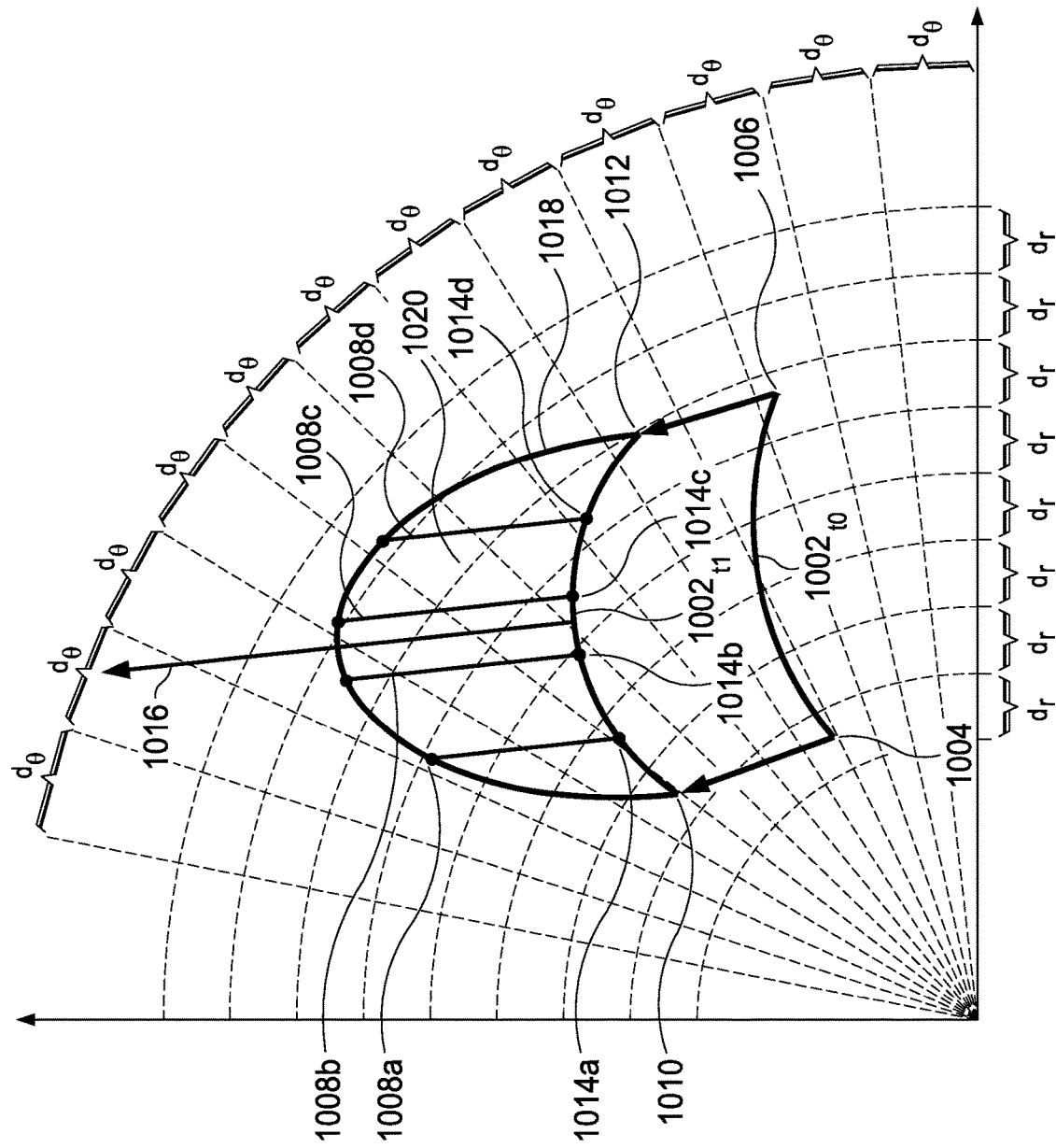
FIG. 10 illustrates an exemplary boundary of a rock chip created by a single cutting element, in accordance with some embodiments of the present disclosure.

FIG. 10 illustrates an exemplary boundary of a rock chip created by a single cutting element, in accordance with some embodiments of the present disclosure. At time $t_0$, a downhole drilling tool model may indicate that an exemplary cutting element 1002$_{t0}$ is located along an arc between endpoints 1004 and 1006. At time $t_1$, a downhole drilling tool model may further indicate that exemplary cutting element 1002$_{t1}$ is located along an arc between endpoints 1010 and 1012. At time $t_1$, cutting element 1002$_{t1}$ may be divided into associated cutlets 1014a-1014d. Existing downhole drilling tool models may update formation heights only in areas bounded by the positions of cutting element 1002 at times $t_0$ and $t_1$. For example, existing downhole drilling tool models may only analyze drill bit interactions with formations in the area bounded by endpoints 1004, 1006, 1010, and 1012. However, in accordance with teachings of the present disclosure, downhole drilling tool models may be supplemented by further analyzing drill bit interactions with formations in advance of the cutting elements by, for example, modeling the creation or removal of three dimensional rock chips.

For example, in some embodiments, after the downhole drilling tool model indicates locations of cutting element 1002 and associated cutlets 1014a-1014d, the downhole drilling tool model may model a removal of three dimensional rock chip 1020. In accordance with the discussions associated with FIGS. 7, 8, 9A, and 9B, a shape of three dimensional rock chip 1020 may be modeled by analyzing two dimensional rock chips associated with cutlets 1014a-1014d.

In some embodiments, for each cutlet 1014a-1014d, a downhole drilling tool model may indicate an associated depth of cut. Further, based on modeled drilling parameters, a critical depth of cut may be determined. Accordingly, for each cutlet 1014a-1014d, if an associated depth of cut is greater than the critical depth of cut, a two dimensional rock chip may be modeled. Rock chip lengths 1008a-1008d may be determined based on modeled drilling parameters such as a modeled rock chip angle. Rock chip lengths 1008a-1008d may be calculated according to the techniques discussed in conjunction with, for example, FIGS. 9A and 9B.

In some embodiments, a downhole drilling tool model may indicate cutting direction 1016 at time $t_1$. Accordingly, rock chips may be modeled as originating at coordinates associated with cutlets 1014a-1014d and running substantially parallel to cutting direction 1016 along rock chip lengths 1008a-1008d. In some embodiments, coordinates of cutlets 1014a-1014d fall between grid points, and a downhole drilling tool model may analyze features of a rock chip based on interstitial cutter coordinates. In the same or other embodiments, coordinates of cutlets 1014a-1014d may be interpolated to correspond to grid points. Chip boundary 1018 may be selected along a path between endpoints 1010 and 1012 that encompasses the ends of rock chip lengths 1008a-1008d. Each grid point within the area circumscribed by chip boundary 1018 and cutting element 1002$_{t1}$ may be assigned a new borehole bottom depth based upon locations and geometries of modeled rock chips. For example, modeled heights of the borehole bottom assigned to grid points associated with cutlets 1014a-1014d may be reduced by the depth of cut of the associate cutlets. Further, modeled heights of the borehole bottom assigned to grid points located along chip boundary 1018 may remain unaltered. Additionally, modeled heights of the borehole bottom assigned to grid points along rock chip lengths 1008a-1008d may be reduced by modeling a crack trajectory as a straight line between cutlets 1014a-1014d and chip boundary 1018 and linearly interpolating rock chip heights along rock chip lengths 1008a-1008d. In order to expand the single cutting element model, discussed in conjunction with FIG. 10, into a full bit model, a downhole drilling tool model may repeat the analysis associated with FIG. 10 for each cutting element on a drill bit at each time step.

FIG. 10 is for illustrative purposes only and modifications, additions or omissions may be made to FIG. 10 without departing from the scope of the present disclosure. For example, although FIG. 10 is discussed using a polar coordinate system, it will be understood that any suitable coordinate system may be used, such as a Cartesian coordinate system or a spherical coordinate system.

Figure 11:
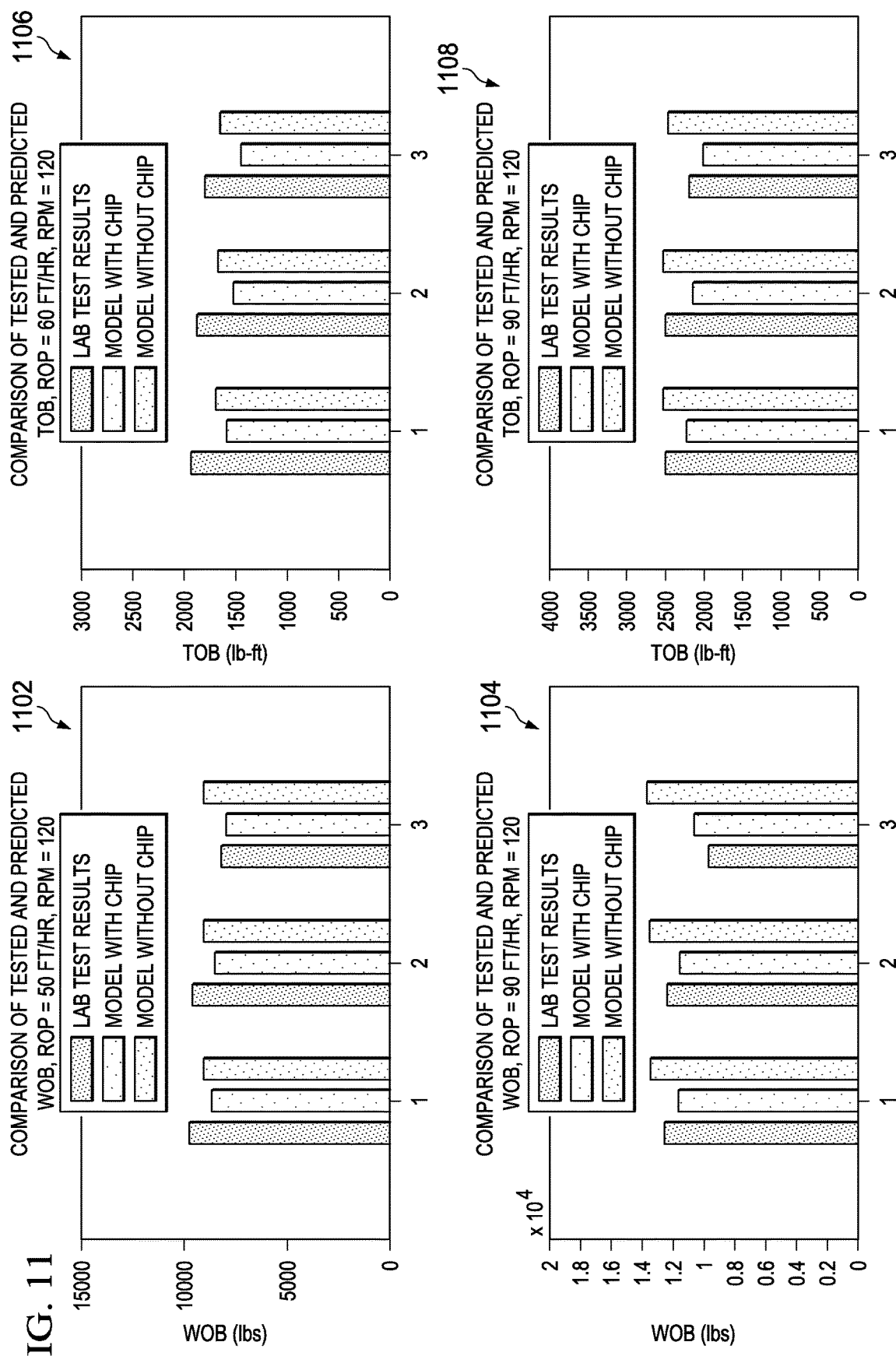
FIG. 11 illustrates exemplary modeled and measured drill bit force data, in accordance with some embodiments of the present disclosure.

Downhole drilling tool models including analysis of three dimensional rock chips may be used to analyze mechanical specific energy of drill bits or drill bit designs. In some embodiments, downhole drilling tool models may be used to calculate simulated bit forces associated with a drill bit. For example a downhole drilling tool model may calculate WOB, TOB, or lateral bit forces. FIG. 11 illustrates exemplary modeled and measured drill bit force data in accordance with some embodiments of the present disclosure. Three bits were tested in a laboratory, and WOB and TOB measurements were recorded. Further, each of the three bits were modeled with two different models: a downhole drilling tool model including three dimensional bit-rock chip interaction, and a downhole drilling tool model without three dimensional bit-rock chip interaction. Each graph in FIG. 11 shows three groups of data, where each group is associated with a drill bit (numbered 1-3). Each column of data associated with a drill bit represents a measured or modeled drilling parameter as indicated by an associated legend. Graphs 1102 and 1104 illustrate modeled and measured WOB data. In both graphs 1102 and 1104, laboratory measured bit 3 is the most efficient bit, while bit 1 is the least efficient. The downhole drilling tool model including an analysis of three dimensional rock chips shows the same relative relationship between bits 1, 2, and 3. However, the downhole drilling tool model without an analysis of three dimensional rock chips predicts that all three bits should perform almost identically. Similarly, graphs 1106 and 1108 illustrate modeled and measured TOB data. In both graph 1106 and 1108, laboratory measured bit 3 is the most efficient bit, while bit 1 is the least efficient. The downhole drilling tool model including an analysis of three dimensional rock chips shows the same relative relationship between bits 1, 2, and 3. However, the downhole drilling tool model without an analysis of three dimensional rock chips predicts that all three bits should perform almost identically. Thus, downhole drilling tool models including an analysis of three dimensional rock chips may be used to analyze and model drilling efficiencies of various drill bits or drill bit designs.

Figure 12:
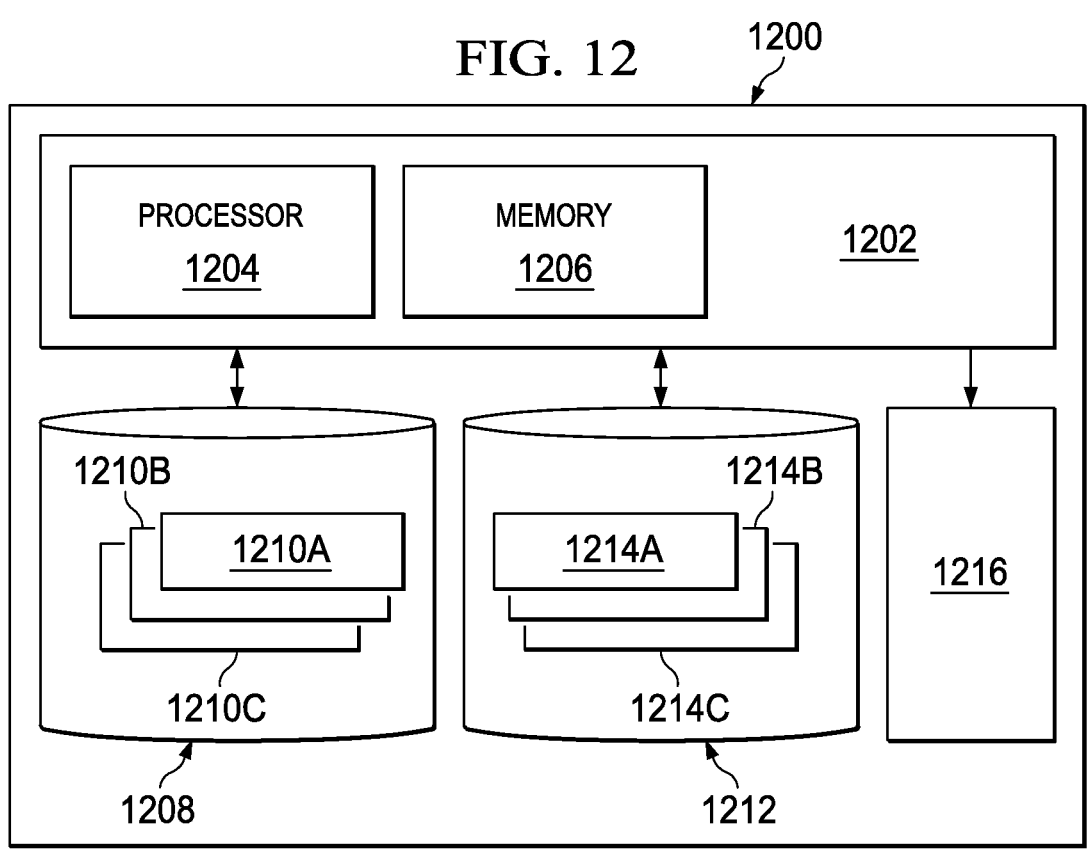
FIG. 12 illustrates a block diagram of an exemplary downhole drilling tool modeling system, in accordance with some embodiments of the present disclosure.

FIG. 12 illustrates a block diagram of an exemplary downhole drilling tool modeling system 1200, in accordance with some embodiments of the present disclosure. Downhole drilling tool modeling system 1200 may be configured to perform three dimensional modeling of interactions between drill bits and rock chips. In some embodiments, downhole drilling tool modeling system 1200 may include downhole drilling tool modeling module 1202. Downhole drilling tool modeling module 1202 may include any suitable components. For example, in some embodiments, downhole drilling tool modeling module 1202 may include processor 1204. Processor 1204 may include, for example a microprocessor, microcontroller, digital signal processor (DSP), application specific integrated circuit (ASIC), or any other digital or analog circuitry configured to interpret and/or execute program instructions and/or process data. In some embodiments, processor 1204 may be communicatively coupled to memory 1206. Processor 1204 may be configured to interpret and/or execute program instructions and/or data stored in memory 1206. Program instructions or data may constitute portions of software for carrying out three dimensional modeling of interactions between drill bits and rock chips, as described herein. Memory 1206 may include any system, device, or apparatus configured to hold and/or house one or more memory modules; for example, memory 1206 may include read-only memory, random access memory, solid state memory, or disk-based memory. Each memory module may include any system, device or apparatus configured to retain program instructions and/or data for a period of time (e.g., computer-readable non-transitory media).

Downhole drilling tool modeling system 1200 may further include bit design database 1208. Bit design database 1208 may be communicatively coupled to downhole drilling tool modeling module 1202 and may provide drill bit designs 1210a-1210c in response to a query or call by downhole drilling tool modeling module 1202. Drill bit designs 1210a-1210c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Drill bit designs 1210a-1210c may specify any suitable configuration of components of a drill bit, such as, for example, components of drill bit 101, discussed above with reference to FIG. 1, 2, or 3A. Although bit design database 1208 is illustrated as including three drill bit designs, bit design database 1208 may contain any suitable number of drill bit designs.

Downhole drilling tool modeling system 1200 may further include rock property database 1212. Rock property database 1212 may be communicatively coupled to downhole drilling tool modeling module 1202 and may provide rock property parameters 1214a-1214c in response to a query or call by downhole drilling tool modeling module 1202. Rock property parameters 1214a-1214c may be implemented in any suitable manner, such as by parameters, functions, definitions, instructions, logic, or code, and may be stored in, for example, a database, file, application programming interface, library, shared library, record, data structure, service, software-as-service, or any other suitable mechanism. Rock property parameters 1214a-1214c may specify any suitable properties or parameters of geophysical formations, such as rock shear strength, rock failure mode, porosity, rock strength, or density. Rock property parameters 1214a-1214c may further include parameters specifying rock chip angles, such as rock chip angle 820 (discussed above with reference to FIG. 8). associated with any suitable combinations of drilling parameters or formation properties. Although rock property database 1212 is illustrated as including three instances of rock property parameters, rock property database 1212 may contain any suitable number of instances of rock property parameters.

In some embodiments, downhole drilling tool modeling module 1202 may be configured to perform three dimensional modeling of interactions between drill bits and rock chips. For example, downhole drilling tool modeling module 1202 may be configured to import one or more instances of drill bit designs 1210a-1210c, and/or one or more instances of rock property parameters 1214a-1214c. Drill bit designs 1210a-1210c, and/or rock property parameters 1214a-1214c may be stored in memory 1206. Downhole drilling tool modeling module 1202 may be further configured to cause processor 1204 to execute program instructions operable to perform three dimensional modeling of interactions between drill bits and rock chips. For example, processor 1204 may, based on drill bit designs 1210a-1210c, generate a model of an initial borehole bottom by modeling a full revolution of a drill bit represented in drill bit designs 1210a-1210c without axial penetration.

Downhole drilling tool modeling module 1202 may be further configured to cause processor 1206 to determine a position of one or more cutting elements on one or more blades of a drill bit, such as cutting elements 128 of FIG. 1. Downhole drilling tool modeling module 1202 may also be configured to identify locations for one or more cutlets associated with cutting elements. For example, downhole drilling tool modeling module 1202 may identify a location in polar coordinates by identifying a radial coordinate and an angular coordinate, such as radial coordinate $R_{504}$ or angular coordinate $\theta_{504}$ of FIG. 5. Downhole drilling tool modeling module 1202 may be further configured to calculate a depth of cut for each cutlet based on the location of the cutlet and a three dimensional model of a borehole bottom, such as depth of cut 814 of FIG. 8. Additionally, downhole drilling tool modeling module 1202 may be configured to model three dimensional rock chips for each cutting element, if a depth of cut of at least one cutlet associated with the cutting element is greater than a critical depth of cut, such as critical depth of cut 910 of FIG. 9. For example, a two dimensional model of a rock chip associated with each cutlet may be calculated, such as modeled rock chip 808. In some embodiments, each two dimensional rock chip may include a rock chip angle (such as rock chip angle 820 of FIG. 8). and a rock chip length (such as rock chip lengths 906a-906k of FIG. 9). In some embodiments, a single rock chip angle may be determined based on rock shear strength, drilling pressure, rock failure mode, porosity, rock strength, density, or any other suitable drilling parameters, or formation property.

Downhole drilling tool modeling module 1202 may be further configured to cause processor to update a three dimensional model of the borehole bottom by removing each of the three dimensional rock chip models. For example, downhole drilling tool modeling module 1202 may be configured to determine a rock chip boundary for each of the three dimensional rock chip models, such as rock chip boundary 1018 of FIG. 10. In some embodiments, a rock chip boundary may include an area bounded by a cutting face of a cutting element and a rock chip length associated with two dimensional models of rock chips associated with cutlets of a cutting element, such as area 1020 of FIG. 10. Further, downhole drilling tool modeling module 1202 may be configured to assign updated depths to a modeled borehole bottom for each coordinate grid point within each rock chip boundary, as previously discussed with reference to FIG. 10.

In some embodiments, downhole drilling tool modeling module 1202 may be configured to calculate forces acting on cutting elements based on an updated three dimensional model of a borehole bottom and positions of cutting elements, such as forces shown in graphs 1102, 1104, 1104, and/or 1108 of FIG. 11. Additionally, downhole drilling tool modeling module 1202 may be configured to estimate a drilling efficiency of the drill bit based on the calculated forces. Further, downhole drilling tool modeling module 1202 may be configured to calculate a mechanical specific energy of a drill bit or drill bit design. In some embodiments, downhole drilling tool modeling module 1202 may be configured to calculate drilling efficiencies for multiple instances drill bit designs 1210a-1210c, where each instance of drill bit design 1210a-1210c is modeled based on a particular set of rock property parameters 1214a-1214c. In other embodiments, downhole drilling tool modeling module 1202 may be configured to calculate drilling efficiencies for a particular instance of drill bit design 1210a-1210c, based on a various different instances of rock property parameters 1214a-1214c. In embodiments where downhole drilling tool modeling module 1202 is configured to model more than one drill bit design-rock property combination, downhole drilling tool modeling module 1202 may be further configured to indicate or select a drill bit designs with a highest efficiency. In other embodiments, downhole drilling tool modeling module 1202 may be configured to rank or order drill bit designs by modeled drilling efficiency. Downhole drilling tool modeling module 1202 may be communicatively coupled to various displays 1216 such that information processed by downhole drilling tool modeling module 1202 (e.g., drill bit efficiency) may be conveyed to operators of drilling equipment.

Modifications, additions, or omissions may be made to FIG. 12 without departing from the scope of the present disclosure. For example, FIG. 12 shows a particular configuration of components of downhole drilling tool modeling system 1200. However, any suitable configurations of components may be used. For example, components of downhole drilling tool modeling system 1200 may be implemented either as physical or logical components. Furthermore, in some embodiments, functionality associated with components of downhole drilling tool modeling system 1200 may be implemented in special purpose circuits or components. In other embodiments, functionality associated with components of downhole drilling tool modeling system 1200 may be implemented in configurable general purpose circuit or components. For example, components of downhole drilling tool modeling system 1200 may be implemented by configure computer program instructions.

Figure 13:
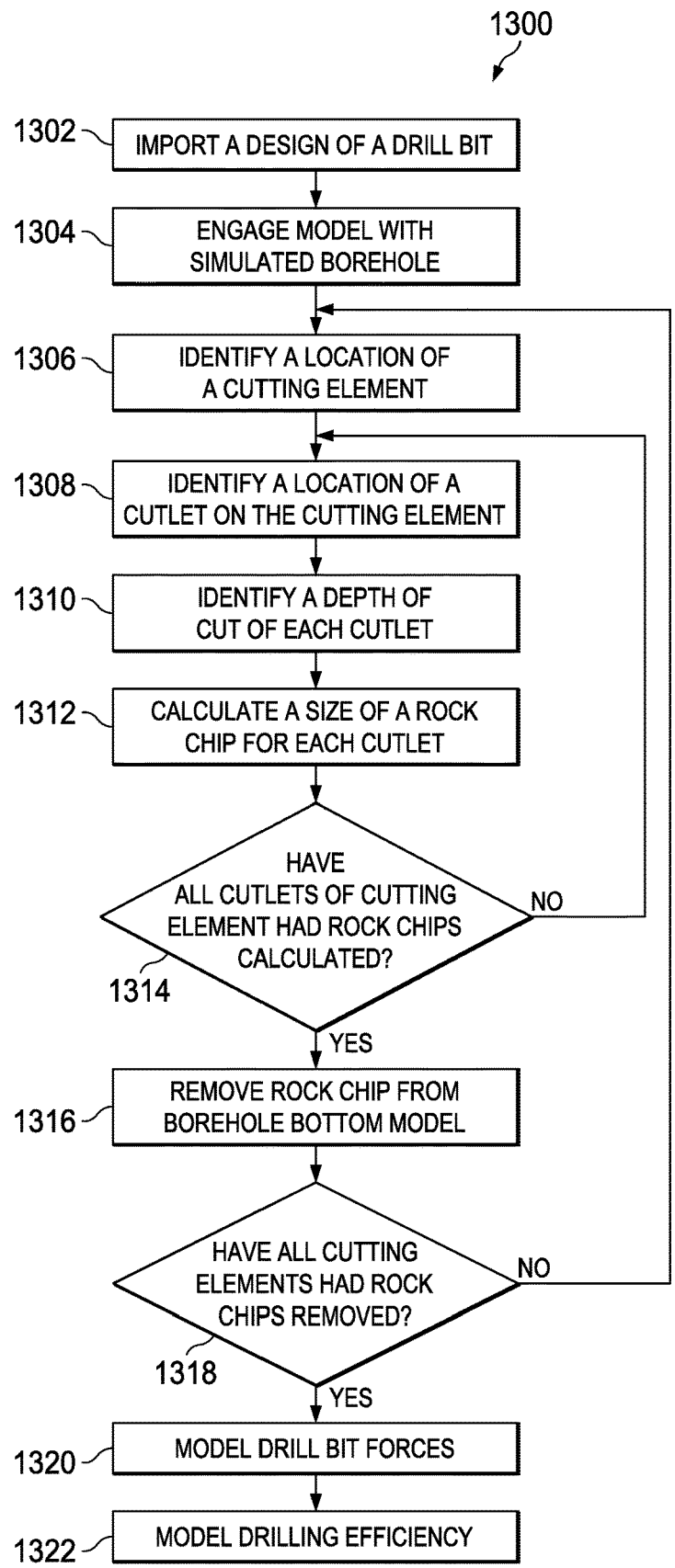
FIG. 13 illustrates a flow chart of an exemplary method for modeling interactions between drill bits and rock chips, in accordance with some embodiments of the present disclosure.

FIG. 13 illustrates a flow chart of an exemplary method 1300 for modeling interactions between drill bits and rock chips, in accordance with some embodiments of the present disclosure. In the illustrated embodiment the cutting structures of the bit including at least the locations and orientations of all cutting elements may have been previously designed. However in other embodiments, method 1300 may include steps for designing the cutting structure of the drill bit.

The steps of method 1300 may be performed by various computer programs, models or any combination thereof, configured to simulate and design drilling systems, apparatuses and devices. For example, in some embodiments, the steps of method 1300 may be performed by downhole drilling tool modeling system 1200, discussed above with reference to FIG. 12. The programs and models may include instructions stored on a computer readable medium and operable to perform, when executed, one or more of the steps described below. The computer readable media may include any system, apparatus or device configured to store and retrieve programs or instructions such as a hard disk drive, a compact disc, flash memory or any other suitable device. The programs and models may be configured to direct a processor or other suitable unit to retrieve and execute the instructions from the computer readable media. Collectively, the computer programs, models, or systems used to simulate and design drilling systems may be referred to as a "downhole drilling tool model."

Method 1300 may start and, at step 1302, the downhole drilling tool model may import a design of a drill bit, such as drill bit designs 1210a-1210c of FIG. 12. In some embodiments, a design of a drill bit may include a representation of a configuration of blades and cutting elements, such as those shown in FIGS. 1 and 2. Further, a design of a drill bit may include coordinate locations of cutting elements with reference to a bit rotational axis. Coordinate locations may be implemented in polar, Cartesian, or spherical coordinate systems.

At step 1304, the downhole drilling tool model may model engaging a drill bit with a simulated borehole. For example, the downhole drilling tool model may create an initial borehole bottom model by simulating a full revolution of the drill bit design with ROP equal to zero. Subsequently, the downhole drilling tool model may model a non-zero ROP. The downhole drilling tool model may model a drill bit engaging a formation by incrementally rotating the model drill bit around an associated rotational axis.

At step 1306, the downhole drilling tool model may identify a location of a cutting element. For example, the downhole drilling tool model may identify a coordinate location of a cutting element such as cutting elements 128 of FIG. 2. Such a location may include a radial distance from a rotational axis, such as radial coordinate $R_{504}$ of FIG. 5. A location may further include an angular coordinate, such as angular coordinate $\theta_{504}$ of FIG. 5.

At step 1308, the downhole drilling tool model may identify a location of a cutlet. For example, cutlets may be associated with discrete points along a cutting edge of a cutting element, such as cutlets 606a-606c of FIG. 6. Further, the downhole drilling tool model may identify a coordinate location of a cutlet, including a radial distance from a rotational axis, such as radial coordinate $R_{504}$ of FIG. 5, and an angular coordinate, such as angular coordinate $\theta_{504}$ of FIG. 5.

At step 1310, the downhole drilling tool model may identify a depth of cut for a cutlet. A depth of cut may include a distance between a surface of a formation and a cutting edge of a cutting element, such as modeled depth of cut 814 of FIG. 8. Depth of cut may depend on drilling parameters such as RPM, ROP, confining pressure, mud pressure, or on formation parameters such as rock shear strength, rock failure mode, or any other suitable drilling parameter or formation property.

At step 1312, the downhole drilling tool model may calculate a size of a two dimensional rock chip for the cutlet. If the depth of cut is less than a critical depth of cut, such as depth of cut associated with cutlet 904a of FIG. 9, no rock chip will be generated. If the depth of cut is greater than a critical depth of cut, such as depth of cut associated with cutlet 904e of FIG. 9, a rock chip will be generated. A size of a rock chip may be determined according to a depth of cut and a chip angle, for example rock chip angle 820 of FIG. 8. A two dimensional rock chip may be modeled as having a straight crack trajectory, such as crack trajectory 818 to simplify modeling computations.

At step 1314, if each cutlet associated with a cutting element has had a rock chip calculated, the method may proceed to step 1316. If fewer than all of the cutlets have had a rock chip calculated, the method may return to step 1308, and proceed by identifying another cutlet.

At step 1316, the downhole drilling tool model may remove a three dimensional rock chip from the borehole bottom model. Cutting elements may have an associated cutting direction, such as cutting direction 1016 of FIG. 10. The downhole drilling tool model may model rock chips associated with cutlets as parallel to the cutting direction, such as rock chip lengths 1008a-1008d of FIG. 10. The downhole drilling tool model may further identify a rock chip boundary that encompasses the cutting element cutting face and the lengths of the rock chips. Further, the downhole drilling tool model may update a borehole bottom depth for a set of points within the rock chip boundary.

At step 1318, if each cutting element has had rock chips removed, the method may proceed to step 1320. If fewer than all cutting elements have had rock chips removed, the method may return to step 1306 and continue by identifying a location of another cutting element.

At step 1320, the downhole drilling tool model may model drill bit forces. In some embodiments, a cutting area is calculated for each cutting element. Forces, such as drag force 612 or penetration force 610 (discussed with reference to FIGS. 6A and 6B), associated with each cutting element may then be calculated. Forces associated with cutting elements may be a function of cutting element orientations, rock strength, cutting area, or any other suitable drilling parameter or formation property. Further, bit forces may be calculated by summing forces associated with cutting elements. For example, TOB or WOB may be estimated for different sets of drilling parameters. Accordingly, FIG. 11 shows exemplary modeled bit force data. Drilling parameters may include different ROP, RPM, different types of rock formations, confining pressures, mud pressures, or any other suitable drilling parameters.

At step 1322, the downhole drilling tool model may estimate drilling efficiency of drill bits or drill bit designs. For example, the downhole drilling tool model may calculate mechanical specific energy of a drill bit. Mechanical specific energy may depend on component bit forces, such as those modeled in step 1320. Further, as shown in FIG. 11, efficiency may be estimated relatively by modeling different drill bits or drill bit designs under the same or similar conditions and examining magnitudes of modeled bit forces.

Method 1300 may be repeated for modeling efficiency of one or more drill bits or drill bit designs. Accordingly, drilling efficiencies of multiple drill bits or drill bit designs may be evaluated and compared. Further, method 1300 may be repeated a single design which is iteratively altered in order to maximize drilling efficiency. Alternatively, method 1300 may be used to select among existing drill bit designs or drill bits to select a more efficient bit for a particular set of drilling parameters. Once one or more drill bit efficiencies are modeled using method 1300, a drill bit may be manufactured according to the calculated design constraints to provide a more efficient drill bit.

Modifications, additions or omissions may be made to method 1300 without departing from the scope of the disclosure. Although the present disclosure has been described with several embodiments, various changes and modifications may be suggested to one skilled in the art. For example, although the present disclosure describes the configurations of cutting elements with respect to drill bits, the same principles may be used to model the efficiency of any suitable drilling tool according to the present disclosure. It is intended that the present disclosure encompasses such changes and modifications as fall within the scope of the appended claims.

What is claimed is:

1. A method of modeling a downhole drilling tool, the method comprising:
   determining a position of a plurality of cutting elements on a plurality of blades disposed about a rotational axis of a downhole drilling tool;
   generating a three dimensional model of a borehole bottom;
   incrementally rotating the plurality of cutting elements about the rotational axis, each incremental rotation comprising:
      identifying a location for each of a first plurality of cutlets associated with each cutting element;
      calculating a depth of cut for each of the first plurality of cutlets based on the location of the cutlet and the three dimensional model of the borehole bottom;
      generating a three dimensional rock chip model for each cutting element, in response to the depth of cut of at least one of the first plurality of cutlets associated with the cutting element being greater than a critical depth of cut, each three dimensional rock chip model divided into a second plurality of cutlets extending in front of the cutting element into the three dimensional model of the borehole bottom and including a two dimensional model of a rock chip associated with each of the second plurality of cutlets; and updating the three dimensional model of the borehole bottom by removing each of the three dimensional rock chip models; and selecting the downhole drilling tool to be used in a drilling operation.

2. A method according to claim 1, wherein updating the three dimensional model of the borehole bottom further comprises determining a rock chip boundary for each of the three dimensional rock chip models, the rock chip boundary including an area bounded by a cutting face of an associated cutting element and a rock chip length associated with the two dimensional model of the rock chip associated with each of the second plurality of cutlets.

3. A method according to claim 2, wherein updating the three dimensional model of the borehole bottom further comprises assigning an updated depth of the borehole bottom for each of a plurality of coordinate grid points within each rock chip boundary.

4. A method according to claim 1, wherein each of the two dimensional models of the rock chip comprises a single rock chip angle and a rock chip length.

5. A method according to claim 4, wherein the single rock chip angle is determined based on a rock shear strength and a drilling pressure.

6. A method according to claim 1, further comprising:
calculating a force acting on each of the plurality cutting elements during a drilling operation based on the updated three dimensional model of the borehole bottom and the positions of the plurality of cutting elements; and
estimating a drilling efficiency of the downhole drilling tool based on the calculated forces.

7. A method according to claim 6, wherein estimating the drilling efficiency of the downhole drilling tool comprises calculating a mechanical specific energy of the downhole drilling tool.

8. A non-transitory machine-readable medium comprising instructions stored therein, the instructions executable by one or more processors to facilitate performing a method for estimating the efficiency of a drilling tool, the method comprising:
determining a position of a plurality of cutting elements on a plurality of blades disposed about a rotational axis of a downhole drilling tool;
generating a three dimensional model of a borehole bottom;
incrementally rotating the plurality of cutting elements about the rotational axis, each incremental rotation comprising:
identifying a location for each of a first plurality of cutlets associated with each cutting element;
calculating a depth of cut for each of the first plurality of cutlets based on the location of the cutlet and the three dimensional model of the borehole bottom;
generating a three dimensional rock chip model for each cutting element, in response to the depth of cut of at least one of the first plurality of cutlets associated with the cutting element being greater than a critical depth of cut, each three dimensional rock chip model divided into a second plurality of cutlets extending in front of the cutting element into the three dimensional model of the borehole bottom and including a two dimensional model of a rock chip associated with each of the second plurality of cutlets; and updating the three dimensional model of the borehole bottom by removing each of the three dimensional rock chip models; and selecting the downhole drilling tool to be used in a drilling operation.

9. The non-transitory machine-readable medium of claim 8, wherein updating the three dimensional model of the borehole bottom further comprises determining a rock chip boundary for each of the three dimensional rock chip models, the rock chip boundary including an area bounded by a cutting face of an associated cutting element and a rock chip length associated with the two dimensional model of the rock chip associated with each of the second plurality of cutlets.

10. The non-transitory machine-readable medium of claim 9, wherein updating the three dimensional model of the borehole bottom further comprises assigning an updated depth of the borehole bottom for each of a plurality of coordinate grid points within each rock chip boundary.

11. The non-transitory machine-readable medium of claim 8, wherein each of the two dimensional models of the rock chip comprises a single rock chip angle and a rock chip length.

12. The non-transitory machine-readable medium of claim 11, wherein the single rock chip angle is determined based on a rock shear strength and a drilling pressure.

13. The non-transitory machine-readable medium of claim 8, wherein the method further comprises:
calculating a force acting on each of the plurality cutting elements during a drilling operation based on the updated three dimensional model of the borehole bottom and the positions of the plurality of cutting elements; and
estimating a drilling efficiency of the downhole drilling tool based on the calculated forces.

14. The non-transitory machine-readable medium of claim 13, wherein estimating the drilling efficiency of the downhole drilling tool comprises calculating a mechanical specific energy of the downhole drilling tool.

15. A downhole drilling tool modeling system, comprising:
a processor;
a memory communicatively coupled to the processor with computer program instructions stored therein, the instructions configured to, when executed by the processor, cause the processor to:
determine a position of a plurality of cutting elements on a plurality of blades disposed about a rotational axis of a downhole drilling tool;
generate a three dimensional model of a borehole bottom;
incrementally rotate the plurality of cutting elements about the rotational axis, each incremental rotation causing the processor to:
identify a location for each of a first plurality of cutlets associated with each cutting element;
calculate a depth of cut for each of the first plurality of cutlets based on the location of the cutlet and the three dimensional model of the borehole bottom;

generate a three dimensional rock chip model for each cutting element, in response to the depth of cut of at least one of the first plurality of cutlets associated with the cutting element being greater than a critical depth of cut, each three dimensional rock chip model divided into a second plurality of cutlets extending in front of the cutting element into the three dimensional model of the borehole bottom and including a two dimensional model of a rock chip associated with each of the second plurality of cutlets; and update the three dimensional model of the borehole bottom by removing each of the three dimensional rock chip models; and select the downhole drilling tool to be used in a drilling operation.

16. The downhole drilling tool modeling system of claim 15, wherein updating the three dimensional model of the borehole bottom further comprises determining a rock chip boundary for each of the three dimensional rock chip models, the rock chip boundary including an area bounded by a cutting face of an associated cutting element and a rock chip length associated with the two dimensional model of the rock chip associated with each of the second plurality of cutlets.

17. The downhole drilling tool modeling system of claim 16, wherein updating the three dimensional model of the borehole bottom further comprises assigning an updated depth of the borehole bottom for each of a plurality of coordinate grid points within each rock chip boundary.

18. The downhole drilling tool modeling system of claim 15, wherein each of the two dimensional models of the rock chip comprises a single rock chip angle and a rock chip length.

19. The downhole drilling tool modeling system of claim 15, wherein the instructions are further configured to cause the processor to:

calculate a force acting on each of the plurality cutting elements during a drilling operation based on the updated three dimensional model of the borehole bottom and the positions of the plurality of cutting elements; and estimate a drilling efficiency of the downhole drilling tool based on the calculated forces.

20. The downhole drilling tool modeling system of claim 19, wherein estimating the drilling efficiency of the downhole drilling tool comprises calculating a mechanical specific energy of the downhole drilling tool.

21. A drilling system, comprising:

a drill string connected to a downhole drilling tool; and a rotary drive configured to rotate at least part of the drill string together with the downhole drilling tool;

wherein efficiency of-the downhole drilling tool is modeled by:

determining a position of a plurality of cutting elements on a plurality of blades disposed about a rotational axis of the downhole drilling tool;

generating a three dimensional model of a borehole bottom;

incrementally rotating the plurality of cutting elements about the rotational axis, each incremental rotation comprising:

identifying a location for each of a first plurality of cutlets associated with each cutting element;

calculating a depth of cut for each of the first plurality of cutlets based on the location of the cutlet and the three dimensional model of the borehole bottom;

generating a three dimensional rock chip model for each cutting element, in response to the depth of cut of at least one of the first plurality of cutlets associated with the cutting element being greater than a critical depth of cut, each three dimensional rock chip model divided into a second plurality of cutlets extending in front of the cutting element into the three dimensional model of the borehole bottom and including a two dimensional model of a rock chip associated with each of the second plurality of cutlets; and updating the three dimensional model of the borehole bottom by removing each of the three dimensional rock chip models; and selecting the downhole drilling tool to be used in a drilling operation.

22. The drilling system of claim 21, wherein updating the three dimensional model of the borehole bottom further comprises determining a rock chip boundary for each of the three dimensional rock chip models, the rock chip boundary including an area bounded by a cutting face of an associated cutting element and a rock chip length associated with the two dimensional model of the rock chip associated with each of the second plurality of cutlets.

23. The drilling system of claim 22, wherein updating the three dimensional model of the borehole bottom further comprises assigning an updated depth of the borehole bottom for each of a plurality of coordinate grid points within each rock chip boundary.

24. The drilling system of claim 21, wherein the efficiency of the downhole drilling tool is further modeled by:

calculating a force acting on each of the plurality cutting elements during a drilling operation based on the updated three dimensional model of the borehole bottom and the positions of the plurality of cutting elements; and estimating a drilling efficiency of the downhole drilling tool based on the calculated forces.

25. The drilling system of claim 24, wherein estimating the drilling efficiency of the downhole drilling tool comprises calculating a mechanical specific energy of the downhole drilling tool.

* * * * *